(12) United States Patent
Lee et al.

(10) Patent No.: US 7,288,454 B2
(45) Date of Patent: Oct. 30, 2007

(54) METHODS OF FORMING CAPACITORS FOR SEMICONDUCTOR MEMORY DEVICES AND RESULTING SEMICONDUCTOR MEMORY DEVICES

(75) Inventors: Ju-Bum Lee, Gyeonggi-do (KR); Shin-Hye Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 44 days.

(21) Appl. No.: 11/195,086

(22) Filed: Aug. 2, 2005

(65) Prior Publication Data

US 2006/0033137 A1    Feb. 16, 2006

(30) Foreign Application Priority Data

Aug. 16, 2004 (KR) ............. 10-2004-0064250

(51) Int. Cl.
  *H01L 21/8242* (2006.01)
(52) U.S. Cl. ............................ 438/253; 438/396
(58) Field of Classification Search ............ 438/253, 438/396
  See application file for complete search history.

(56) References Cited

U.S. PATENT DOCUMENTS 6,486,025 B1 * 11/2002 Liu et al. ................... 438/253

2006/0046382 A1 * 3/2006 Yoon et al. ................. 438/254

FOREIGN PATENT DOCUMENTS

| JP | 2003-142605 | 5/2003 |
| KR | 1020030075907 A | 9/2003 |
| KR | 1020030093817 A | 12/2003 |

* cited by examiner

*Primary Examiner*—Jack Chen
(74) *Attorney, Agent, or Firm*—Myers Bigel Sibley & Sajovec

(57) ABSTRACT

Methods of forming capacitors include forming a first mold layer and a second mold layer on a substrate, forming storage electrodes through the mold layers, the storage electrodes arranged in rows extending in a first direction and spaced apart from adjacent storage electrodes along the first direction by a first interval. The storage electrodes are spaced apart from adjacent storage electrodes along a second direction oblique to the first direction by a second interval smaller than the first interval. First and second sacrificial layers are formed on the storage electrodes layer partially filling up a gap between adjacent storage electrodes along the first direction and filling up a gap between the adjacent storage electrodes along the second direction. Sacrificial spacers may be formed on sidewalls of the storage electrodes by etching the sacrificial layers. The second mold layer may be etched using the sacrificial spacers as etching masks to define a plurality of stabilizing structures. Resulting devices are also disclosed.

14 Claims, 33 Drawing Sheets

METHODS OF FORMING CAPACITORS FOR SEMICONDUCTOR MEMORY DEVICES AND RESULTING SEMICONDUCTOR MEMORY DEVICES

CROSS REFERENCE TO RELATED APPLICATION

This application claims priority under 35 USC § 119 to Korean Patent Application No. 2004-64250 filed on Aug. 16, 2004, the disclosure of which is incorporated herein by reference in its entirety.

FIELD OF THE INVENTION

The present invention relates to methods of forming capacitors. More particularly, the present invention relates to methods of forming capacitors for semiconductor devices.

BACKGROUND

Semiconductor memory devices such as dynamic random access memory (DRAM) devices may be programmable and erasable, such that binary data may be repeatedly stored in and/or read from the semiconductor devices. A typical cell of a semiconductor memory device may include one transistor and one capacitor. The capacitor may have a storage electrode, a dielectric layer and a plate electrode. To increase the ability of a semiconductor memory device to store electric charge (which is representative of data stored by the device), the capacitance of the capacitor may be increased.

Recently, the degree of integration of DRAM devices has reached the gigabyte scale, which may require a corresponding decrease in the cell area of DRAM devices. In order to increase the density of DRAM devices formed on a single substrate, various alternative capacitor geometries have been investigated. For example, to save space on a semiconductor substrate, capacitors have been designed in which the opposing plates of the capacitor extend in a direction perpendicular to the semiconductor substrate instead of parallel to the substrate. Accordingly, capacitors having various structures such as a tube-shaped structure, a cylindrical structure and/or a mesh-shaped structure have been proposed in an attempt to form capacitors having a desired capacitance and area. When DRAM devices have a critical dimension of below about 0.11 μm, the cell area of the DRAM device is also drastically reduced, which means that in order to have a desired capacitance, the capacitor may have a very large aspect ratio (i.e. a very large ratio of height to width). When capacitors in a DRAM device have a considerably large aspect ratio, adjacent capacitors may become tilted toward each other or even fall down, which may cause an electrical short between adjacent capacitors. Such a condition is known as a 2-bit failure of capacitors.

FIG. 1 is a cross-sectional view illustrating storage electrodes 14 of conventional cylindrical capacitors. Referring to FIG. 1, a conventional cylindrical capacitor 1 includes a storage electrode 14 contacting a contact pad 12 formed on a semiconductor substrate 10. The storage electrode 14 of the capacitor may be electrically connected through the contact pad 12 to a metal oxide semiconductor (MOS) transistor (not shown) formed on the semiconductor substrate 10.

To increase the capacitance of the capacitor, the height of the storage electrode 14 may be increased. However, when the height of the storage electrode 14 becomes large, the storage electrode 14 may lean on an adjacent storage electrode 14, or adjacent storage electrodes 14 may fall down toward each other as shown by the dotted lines in FIG. 1. This 2-bit failure between adjacent storage electrodes 14 may cause an electrical failure of the semiconductor device.

In order to reduce the likelihood of a failure such as a 2-bit failure described above, a stabilizing member having a mesh structure may be formed to enclose the storage electrode of a capacitor. Adjacent stabilizing members may be connected to each other in an attempt to prevent the storage electrodes from falling down or leaning on each other.

In forming the stabilizing member, a first mold layer, a second mold layer and a third mold layer may be sequentially formed on a semiconductor substrate. The mold layers may be selectively etched to form holes therethrough which expose a contact region of the semiconductor substrate. After a conductive layer and a sacrificial layer are formed to fill the holes, the conductive layer and the sacrificial layer may be partially removed by a chemical mechanical polishing (CMP) process until the third mold layer is exposed, thereby forming storage electrodes in the holes. When the third mold layer is removed, the second mold layer and upper portions of the storage electrodes may be exposed. A silicon oxide layer may be formed on the second mold layer and the exposed portions of the storage electrodes. Then, the silicon oxide layer may be anisotropically etched to form spacers on sidewalls of the storage electrodes. Using the spacers as etching masks, the second mold layer may be partially etched to thereby form stabilizing members enclosing the upper portions of the storage electrodes.

However, the silicon oxide layer used to form the spacers may have poor step coverage. In addition, the surface profile of the mold layers may cause a loading effect on the silicon oxide layer. As a result, the stabilizing members may not be uniformly formed on the sidewalls of the storage electrodes. Additionally, the CMP process used for forming the storage electrodes may cause a dishing effect to occur, which may cause the storage electrodes to have non-uniform heights. The foregoing problems may cause the spacers to be non-uniform. Thus, forming uniform stabilizing members may be difficult.

SUMMARY

Some methods of forming capacitors according to embodiments of the invention include forming a first mold layer and a second mold layer on a substrate, forming storage electrodes arranged in a regular two dimensional configuration through the second mold layer and the first mold layer, upper portions of the storage electrodes being protruded from the second mold layer, forming a first sacrificial layer on the storage electrodes and the second mold layer, the sacrificial layer partially filling up a gap between adjacent storage electrodes along a first direction and filling up a gap between the adjacent storage electrodes along a second direction, a first recess being formed between the adjacent storage electrodes along the first direction, forming sacrificial spacers on sidewalls of the storage electrodes by etching the first sacrificial layer, the sacrificial spacers defining an opening exposing the second mold layer between the adjacent storage electrodes along the first direction, etching the exposed second mold layer to expose the first mold layer, removing the first mold layer and the sacrificial spacers, and forming a dielectric layer and a plate electrode on the storage electrodes.

Methods according to some embodiments of the invention further include forming a second sacrificial layer on the first sacrificial layer, wherein forming sacrificial spacers on the sidewalls of the storage electrode includes etching the second and the first sacrificial layers to define an opening exposing the second mold layer. Forming the second sacrificial layer may further include partially filling the first recess to thereby form a second recess.

In some embodiments of the invention, the first sacrificial layer may be formed by a chemical vapor deposition process using an ozone gas and a tetraethyl orthosilicate gas. The second sacrificial layer may be formed by a plasma enhanced chemical vapor deposition process using an oxygen gas and a tetraethyl orthosilicate gas.

In some embodiments according to the invention, forming the storage electrodes includes forming a third mold layer on the second mold layer, forming first openings exposing the contact structures through the third mold layer, the second mold layer and the first mold layer, forming a conductive layer on the contact structures, sidewalls of the first openings and the third mold layer, forming a third sacrificial layer on the conductive layer, removing portions of the third sacrificial layer and the conductive layer until the third mold layer is exposed, to thereby form storage electrodes and sacrificial layer patterns within the storage electrodes, and exposing the upper portions of the storage electrodes by removing the third mold layer and upper portions of the sacrificial layer patterns.

In some embodiments, the first mold layer and the third mold layer pattern include silicon oxide, and the second mold layer includes silicon nitride. In further embodiments, the third sacrificial layer is formed of the same material as the third mold layer.

According to some embodiments of the invention, forming the first openings further includes forming a mask pattern on the third mold layer, and anisotropically etching the third mold layer, the second mold layer and the first mold layer using the mask pattern as an etching mask. The mask pattern may include polysilicon.

In further embodiments, forming the storage electrodes includes forming a third mold layer on the second mold layer, forming a polishing stop layer on the third mold layer, forming first openings exposing the contact structures through the polishing stop layer, the third mold layer, the second mold layer and the first mold layer, forming a conductive layer on the contact structures, sidewalls of the first openings and the polishing stop layer, forming a third sacrificial layer on the conductive layer to fill up the first openings, removing the third sacrificial layer and the conductive layer until the polishing stop layer is exposed to thereby form storage electrodes and sacrificial layer patterns in the storage electrodes, and exposing upper portions of the storage electrodes by removing the polishing stop layer, the third mold layer and upper portions of the sacrificial layer patterns.

In some embodiments, the polishing stop layer comprises silicon nitride. Some embodiments according to the invention further include forming a buffer oxide layer on the polishing stop layer, forming a mask pattern on the buffer oxide layer, and anisotropically etching the buffer oxide layer, the polishing stop layer, the third mold layer, the second mold layer and the first mold layer using the mask pattern as an etching mask.

Methods according to further embodiments of the invention include forming a first mold layer and a second mold layer on a substrate where contact structures are formed, forming storage electrodes through the second mold layer and the first mold layer, the storage electrodes arranged in a plurality of rows extending in a first direction, the storage electrodes spaced apart from adjacent storage electrodes along the first direction by a first interval, and upper portions of the storage electrodes being protruded from the second mold layer, wherein successive rows of storage electrodes are offset from one another such that a storage electrode in one row is arranged in the first direction between two storage electrodes in a neighboring row. The first direction may correspond to a bit line structure or a word line structure of a semiconductor memory device.

In some embodiments, a storage electrode in one row is arranged in the first direction about half way between two adjacent storage electrodes in a neighboring row. The storage electrodes may be spaced apart from adjacent storage electrodes along a second direction oblique to the first direction by a second interval smaller than the first interval.

In some embodiments, methods according to the invention may further include forming a first sacrificial layer on the storage electrodes and the second mold layer, the sacrificial layer partially filling up a gap between adjacent storage electrodes along the first direction, thereby forming a first recess between adjacent storage electrodes along the first direction, and filling up a gap between the adjacent storage electrodes along the second direction; forming sacrificial spacers on sidewalls of the storage electrodes, the sacrificial spacers defining an opening exposing the second mold layer between the adjacent storage electrodes along the first direction, etching the exposed second mold layer to expose the first mold layer, removing the first mold layer and the sacrificial spacers, and forming a dielectric layer and a plate electrode on the storage electrodes.

Semiconductor memory devices according to some embodiments of the invention include a plurality of storage capacitors including cylindrical storage electrodes arranged in a plurality of rows extending in a first direction, wherein the storage electrodes are spaced apart from adjacent storage electrodes along the first direction by a first interval, and wherein the storage electrodes are spaced apart from adjacent storage electrodes along a second direction oblique to the first direction by a second interval smaller than the first interval, and a stabilizing member on a sidewall of each storage electrode, wherein a stabilizing member of a storage electrode contacts a stabilizing member of an adjacent storage electrode along the second direction.

In some embodiments, successive rows of storage electrodes are offset from one another such that a storage electrode in one row may be arranged in the first direction between two storage electrodes in a neighboring row. In particular embodiments, a storage electrode in one row may be arranged in the first direction about half way between two adjacent storage electrodes in a neighboring row. A gap may be formed between the stabilizing structures of adjacent storage electrodes along the first direction.

DETAILED DESCRIPTION OF EMBODIMENTS ACCORDING TO THE INVENTION

Figure 1:
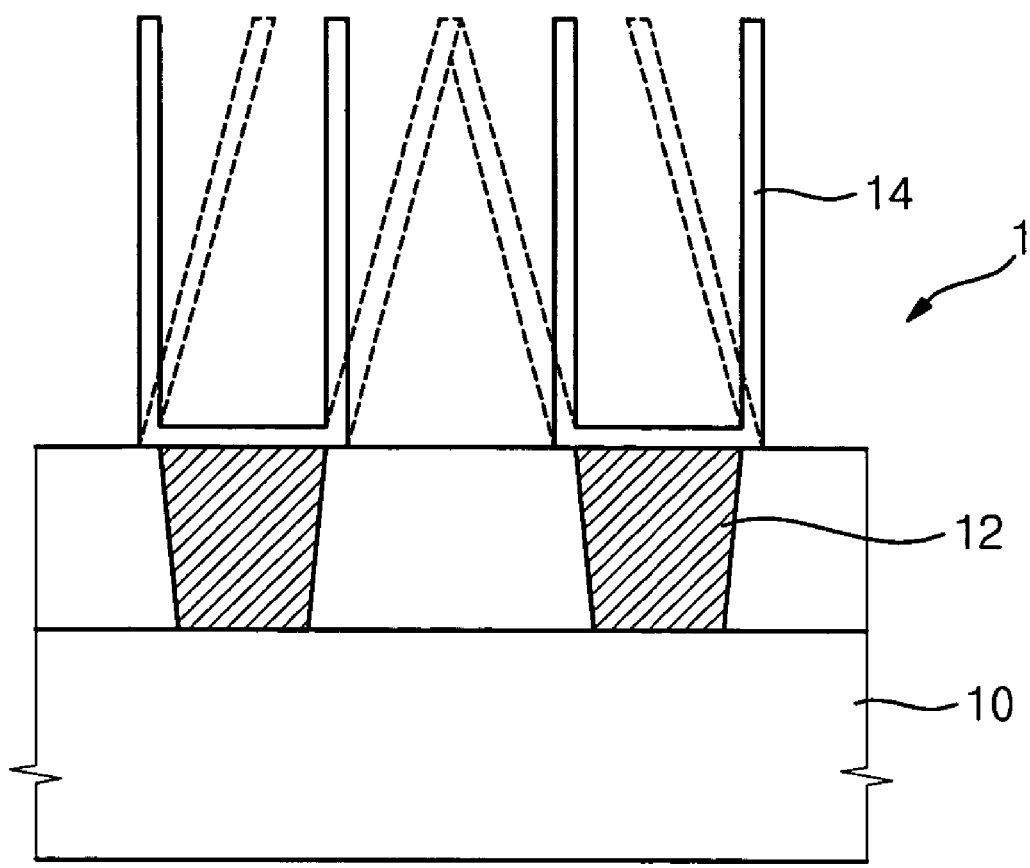
FIG. 1 is a cross-sectional view illustrating conventional cylindrical capacitors.

Embodiments of the invention will now be described in conjunction with the Figures. It will be understood that when an element or layer is referred to as being "on", "connected to", "coupled to" or "combined with" another element or layer, it can be directly on, connected or coupled to the other element or layer or intervening elements or layers may be present. In contrast, when an element is referred to as being "directly on," "directly connected to", "directly coupled to" or "directly combined with" another element or layer, there are no intervening elements or layers present. Like reference numerals refer to like elements throughout. As used herein, the term "and/or" includes any and all combinations of one or more of the associated listed items. It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "includes", "including", "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the common abbreviation "e.g.", which derives from the Latin phrase "exempli gratia," may be used to introduce or specify a general example or examples of a previously mentioned item, and is not intended to be limiting of such item. If used herein, the common abbreviation "i.e.", which derives from the Latin phrase "id est," may be used to specify a particular item from a more general recitation.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the face through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

FIGS. 2, 4 to 7, 9, 10, 12, 13, 15, 16, 18 to 20 and 22 to 25 are cross-sectional views illustrating methods of forming capacitors in accordance with some embodiments of the invention. FIGS. 3, 8, 11, 14, 17 and 21 are plan views illustrating methods of forming capacitors in accordance with some embodiments of the present invention.

Figure 2:
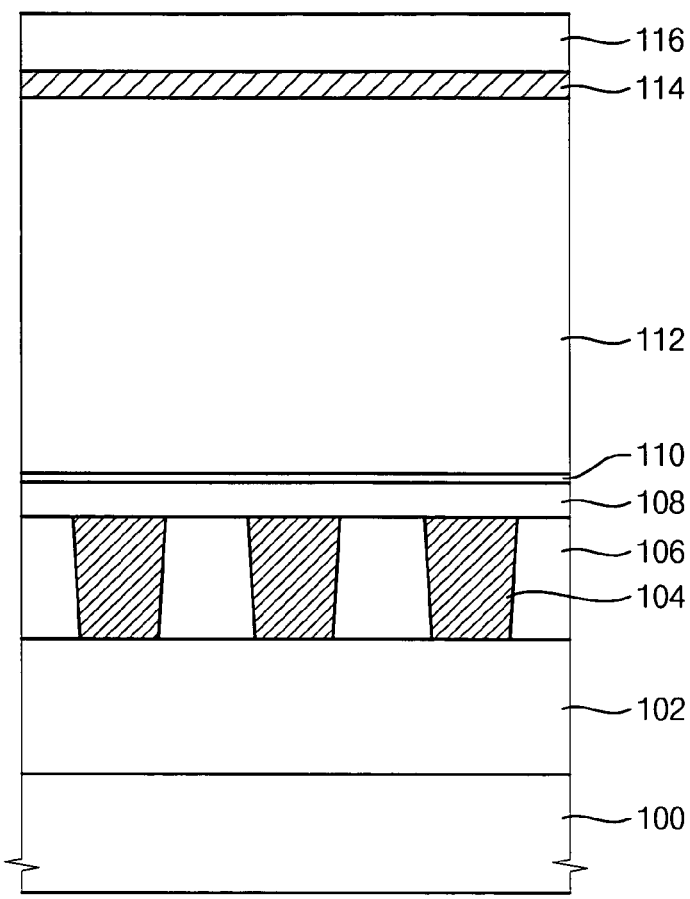
FIGS. 2, 4 to 7, 9, 10, 12, 13, 15, 16, 18 to 20 and 22 to 25 are cross-sectional views illustrating methods of manufacturing capacitors in accordance with some embodiments of the invention.

FIG. 2 is a cross-sectional view illustrating steps of forming a first insulating interlayer 102, contact structures 104, a second insulating interlayer 106, a third insulating interlayer 108, an etch stop layer 110, a first mold layer 112, a second mold layer 114, and a third mold layer 116 on a substrate 100.

The first insulating interlayer 102 may be formed above a lower structure (not shown) that is formed on the substrate 100. The lower structure may include, for example, a metal oxide semiconductor (MOS) transistor, a pad, a conductive layer pattern, a conductive wiring, a contact region, a contact, etc. The MOS transistor may include, for example, a gate electrode, a gate mask pattern and a gate spacer formed on the semiconductor substrate 100. The lower structure may further include word line structures extending along a first direction crossing the semiconductor substrate 100, and bit line structures extending along a second direction substantially perpendicular to the first direction. Each of the bit line structures may include a bit line conductive pattern, a bit line mask pattern and a bit line spacer. When the MOS transistor is formed on the semiconductor substrate 100, contact regions may be formed adjacent to the gate structure of the MOS transistor. Some contact regions may be electrically connected to a capacitor (see FIGS. 24 and 25), whereas other contact regions may be electrically connected to the bit line structures. The semiconductor substrate 100 may include a silicon wafer, a silicon-on-insulator (SOI) substrate, or any other suitable substrate.

The first insulating interlayer 102 may include an oxide such as boro-phosphor silicate glass (BPSG), phosphor silicate glass (PSG), undoped silicate glass (USG), spin-on glass (SOG), plasma enhanced-tetraethyl orthosilicate (PE-TEOS), and/or high-density plasma-chemical vapor deposition (HDP-CVD) oxide, etc. These oxides can be used alone or in a mixture thereof.

The second insulating interlayer 106 may be formed on the first insulating interlayer 102. The contact structures 104 may be formed through the second insulating interlayer 106 so that the contact structures 104 may be electrically connected to the contact regions (not shown) of the semiconductor substrate 100. The contact structures 104 may include, for example, contacts, pads or other conductive structures. The second insulating interlayer 106 may include an oxide such as BPSG, PSG, USG, SOG, PE-TEOS, and/or HDP-CVD oxide, etc. These oxides can be used alone or in a mixture thereof. In some embodiments of the invention, the second insulating interlayer 106 may be formed using substantially the same material as the first insulating interlayer 102. In other embodiments of the invention, the second insulating interlayer 106 may be formed using a material that is substantially different from that of the first insulating interlayer 102.

The third insulating interlayer 108 may be formed on the second insulating interlayer 106 and the contact structures 104. The third insulating interlayer 108 may include an oxide such as BPSG, PSG, USG, SOG, PE-TEOS, and/or HDP-CVD oxide, etc. These oxides can be used alone and/or in a mixture of one or more of such oxides. As described above, the third insulating interlayer 108 may be formed using an oxide that is the same as or substantially similar to the first insulating interlayer 102 and/or the second insulating interlayer 106. Alternatively, the third insulating interlayer 108 may be formed using an oxide substantially different from that of the first insulating interlayer 102 and/or the second insulating interlayer 106. The third insulating interlayer 108 electrically may insulate a bit line structure (not shown) of a semiconductor memory device from a storage electrode 126 (see FIGS. 9 and 10).

An etch stop layer 110 may be formed on the third insulating interlayer 108. A first mold layer 112 may be formed on the etch stop layer 110. The etch stop layer 110 may be formed using a material that has an etching selectivity with respect to the third insulating interlayer 108 and the first mold layer 112. For example, the etch stop layer 110 may include a nitride such as silicon nitride when the third insulating interlayer 108 and the first mold layer 112 are oxide layers.

Figure 9:
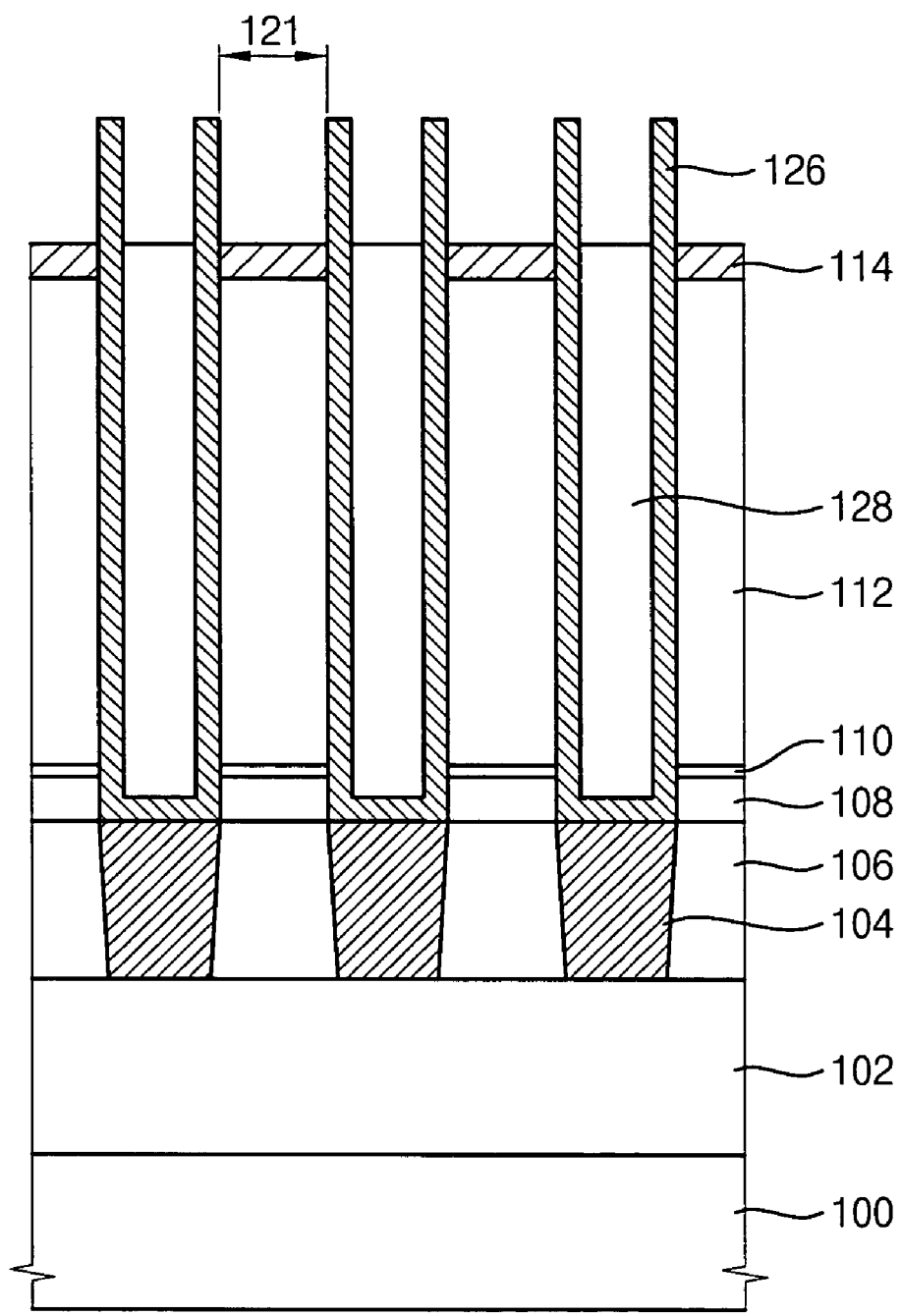

The first mold layer 112 assists in the formation of the storage electrode 126 (see FIG. 9). The first mold layer 112 may include an oxide such as HDP-CVD oxide, USG, BPSG, PSG, PE-TEOS, and/or SOG, etc. These oxides can be used alone and/or in a mixture thereof. The first mold layer 112 may have a thickness of about 5,000 to about 50,000 Å measured from an upper face of the etch stop layer 110. However, the thickness of the first mold layer 112 may vary in accordance with the desired capacitance of the capacitor. That is, because the height of the capacitor is primarily determined by the thickness of the first mold layer 112, the capacitance of the capacitor may be selected by varying the thickness of the first mold layer 112. In addition, in accordance with embodiments of the invention, a stabilizing member 144 (see FIGS. 22 and 23) may be formed to enclose the storage electrodes 126 so that adjacent capacitors may be structurally stable, even though the capacitor may have an extremely large height. As a result, a capacitor formed in accordance with some embodiments of the invention may have a have a height, and thus a capacitance, considerably larger than that of a conventional capacitor.

A second mold layer 114 may be formed on the first mold layer 112. The second mold layer 114 may be formed using a material that has a high etching selectivity relative to the first mold layer 112. For example, the second mold layer 114 may include a nitride such as silicon nitride, an oxynitride such as silicon oxynitride, or an oxide having a high etching selectivity relative to the first mold layer 112 for a desired etchant. The second mold layer 114 may be used in the formation of the stabilizing member 144 (see FIGS. 22 and 23). The second mold layer 114 may have a thickness of about 400 to about 5,000 Å measured from an upper face of the first mold layer 112. However, the thickness of the second mold layer 114 may be varied to achieve specific design objectives.

A third mold layer 116 may be formed on the second mold layer 114. The third mold layer 116 may have a thickness of about 1,000 to about 6,000 Å measured from an upper face of the second mold layer 114. The third mold layer 116 may be formed using an oxide such as HDP-CVD oxide, PE-TEOS, USG, PSG, BPSG, and/or SOG, etc. These oxides can be used alone and/or in a mixture of one or more such oxides. The third mold layer 116 may include a material having properties substantially similar to those of the first mold layer 112. Alternatively, the mold layer 116 may include an oxide substantially different from the material of the first mold layer 112.

With respect to a given etchant (i.e. an etching solution or an etching gas) for etching oxide, the first mold layer 112 may have a first etching rate substantially similar to a third etching rate of the third mold layer 116. However, the second mold layer 114 may have a second etching rate substantially different from the first etching rate and/or the third etching rate with respect to the etchant in question. For example, an etch selectivity (defined as a ratio of etch rates of two different materials for a given etch process) of the first mold layer 112 or the third mold layer 116 with respect to the second mold layer 114 for a given etch process may be 200:1 or more. When the first and the third mold layers 112 and 116 include HDP-CVD oxide, the second mold layer 114 may, for example, include silicon nitride. Thus, the first and the third mold layers 112 and 116 may be more rapidly etched than the second mold layer 114 using an etching solution that includes an etchant such as hydrogen fluoride and/or an etching solution that includes ammonium hydroxide, hydrogen peroxide and deionized (DI) water.

Figure 3:
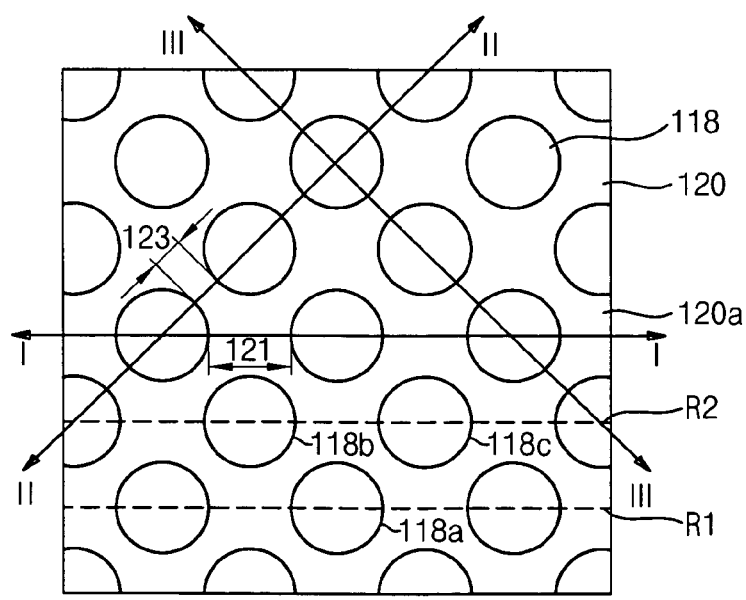
FIGS. 3, 8, 11, 14, 17 and 21 are plan views illustrating the methods of manufacturing capacitors in accordance with some embodiments of the invention.
Figure 4:
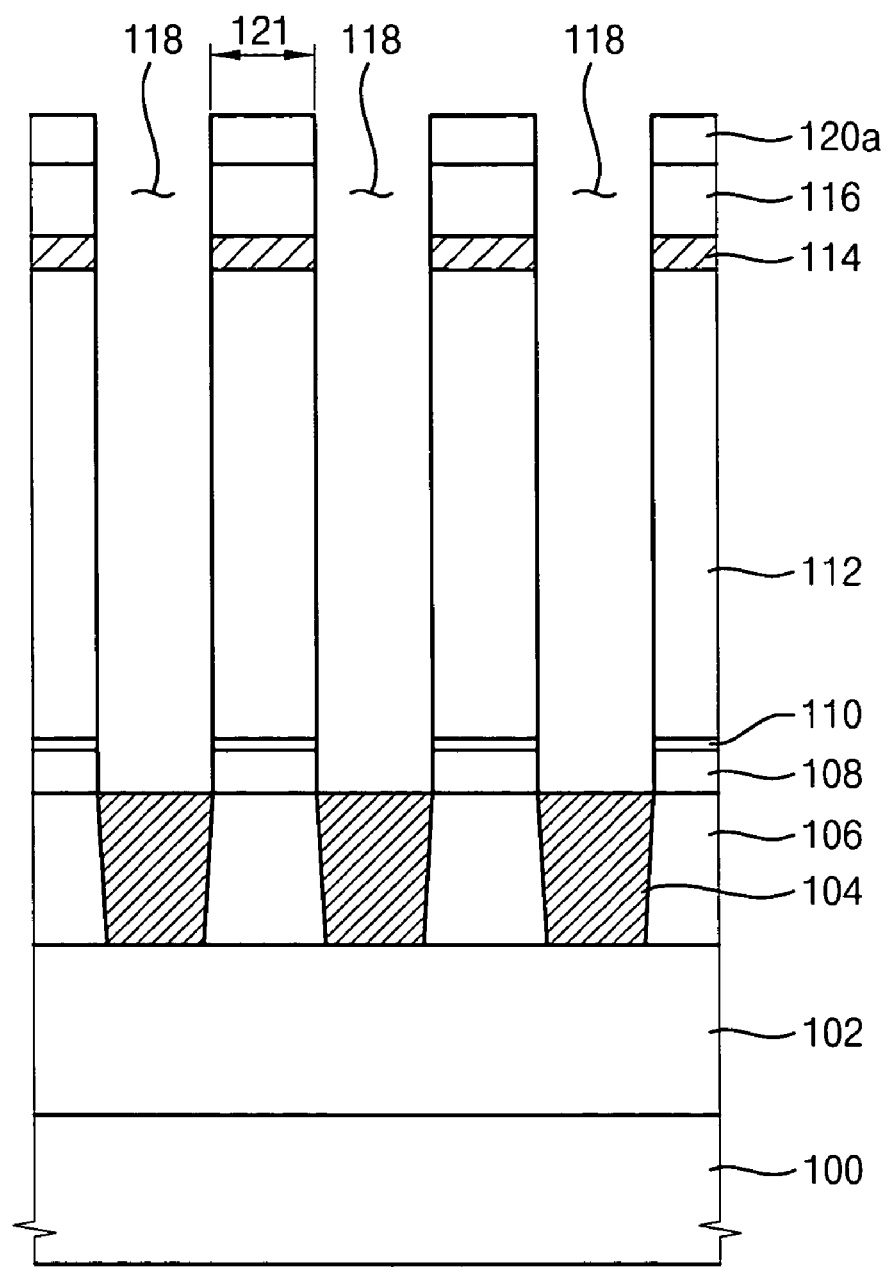

FIG. 3 is a plan view of the semiconductor substrate 100 illustrating the formation of first openings 118 exposing the contact structures 104. FIG. 4 is a cross-sectional view illustrating the semiconductor substrate 100 taken along a line of I-I in FIG. 3, and FIG. 5 is a cross-sectional view illustrating the semiconductor substrate 100 taken along a line of II-II or a line of III-III in FIG. 3.

Figure 5:
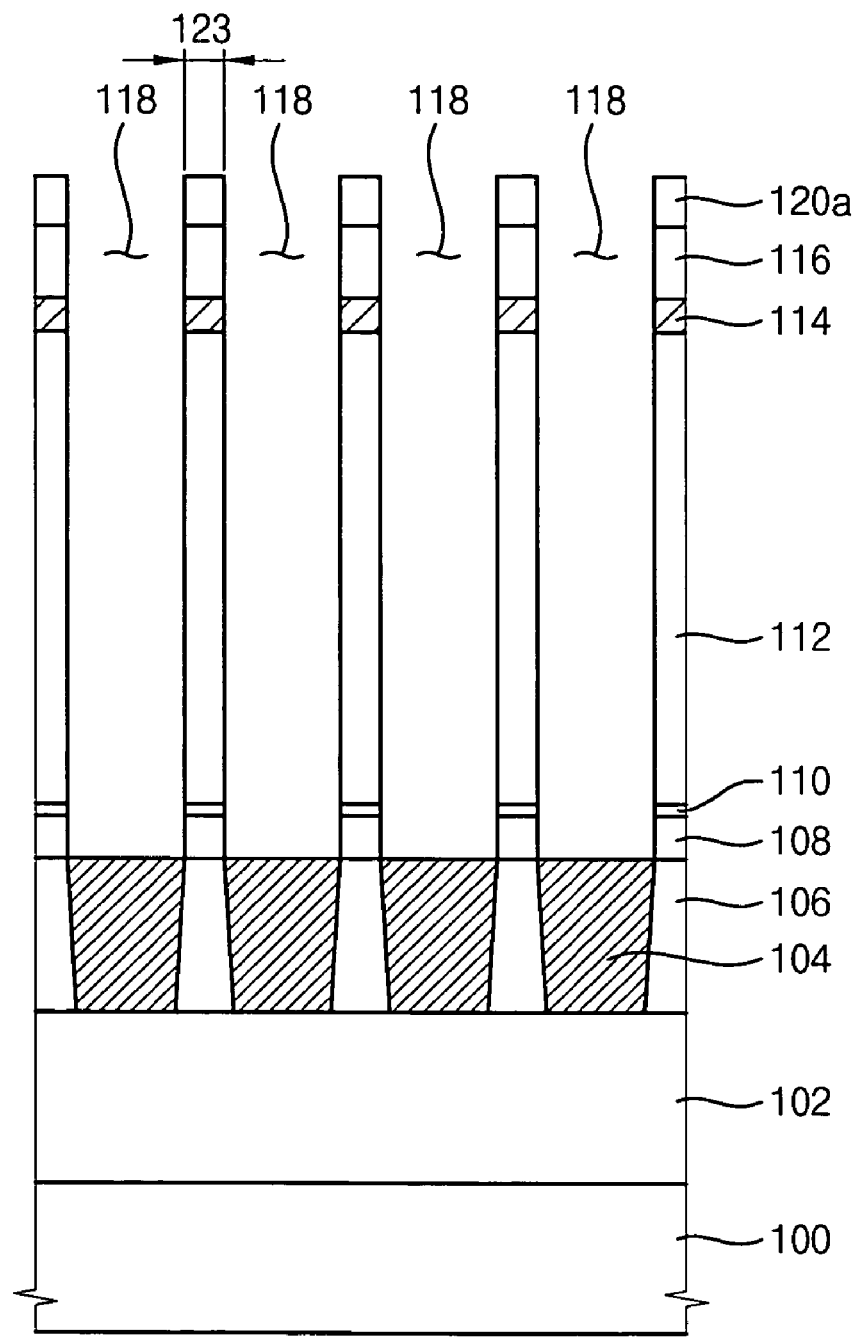

Referring to FIGS. 3 to 5, after an optional mask layer 120 may be formed on the third mold layer 116, a photoresist pattern (not shown) may be formed on the mask layer 120. The mask layer 120 may be formed using a material that has an etching selectivity relative to the first and the third mold layers 112 and 116. For example, the mask layer 120 may include a nitride such as silicon nitride, polysilicon and/or an oxynitride such as silicon oxynitride. Additionally, the mask layer 120 may be formed on the third mold layer 116 by a chemical vapor deposition (CVD) process, a low pressure chemical vapor deposition (LPCVD) process, an atomic layer deposition (ALD) process, and/or any other suitable process for forming a mask layer having appropriate physical properties.

The mask layer 120 may be etched using the photoresist pattern as an etching mask to thereby form a mask pattern 120a on the third mold layer 116. The photoresist pattern may be removed from the mask pattern 120a by an ashing process and/or a stripping process.

Using the mask pattern 120a as an etching mask, the third mold layer 116, the second mold layer 114, the first mold layer 112, the etch stop layer 110 and the third insulating interlayer 108 are partially etched, thereby forming the first openings 118 through the third mold layer 116, the second mold layer 114, the first mold layer 112, the etch stop layer 110 and the third insulating interlayer 108. The first openings 118 may expose the contact structure 104 buried in the second insulating interlayer 106.

In some embodiments of the invention, an anti-reflective layer may be formed on the mask layer 120 to provide a desired process margin for the photolithography process used to form the mask pattern 120a.

In some embodiments of the invention, a photoresist pattern may be formed directly on the third mold layer 116 without the formation of the mask pattern 120a. In that case, the first openings 118 may be formed using the photoresist pattern as an etching mask.

As illustrated in FIG. 3, the first openings 118 may be arranged in a regular, two-dimensional arrangement (i.e. a matrix structure) that includes a plurality of rows and columns. Adjacent first openings 118 may be separated by a first interval 121 along a first direction substantially parallel to the line of I-I. For example, the first direction may be parallel to word line structures (not shown) or bit line structures (not shown) formed in the semiconductor substrate 100. In addition, the adjacent first openings 118 may be spaced apart from each other by a second interval 123 along a second direction substantially parallel with the line of III-III or the line of III-III. For example, the second direction may be a diagonal line relative to the orientation of the word line structures and/or the bit line structures. According to some embodiments of the invention, the first interval 121 may be substantially larger than the second interval 123. That is, the first openings 118 may be more closely spaced in the second direction than the first direction.

As illustrated in FIG. 3, in some embodiments according to the invention, successive rows of first openings 118 arranged along successive word line structures and/or bit line structures may be offset from one another such that a first opening 118a in one row (e.g., row R1) is arranged in the first direction between two first openings 118b, 118c in a neighboring row (e.g., row R2). Thus, the second direction may be defined by reference to an opening 118 in one row and one of two adjacent first openings 118 in a neighboring row. In some embodiments, a first opening 118a in one row may be arranged in the first direction about half way between two first openings 118b, 118c in a neighboring row. Accordingly, as illustrated in FIGS. 3-5, the first openings 118 may be arranged in a matrix having a first orthogonal dimension (e.g., parallel or perpendicular to the line of I-I) along which the openings are relatively non-closely spaced and a second oblique dimension (e.g., parallel or perpendicular to the lines of II-II or III-III) along which the first openings 118 are relatively closely spaced compared to the spacing of first openings 118 along an orthogonal dimension.

Figure 6:
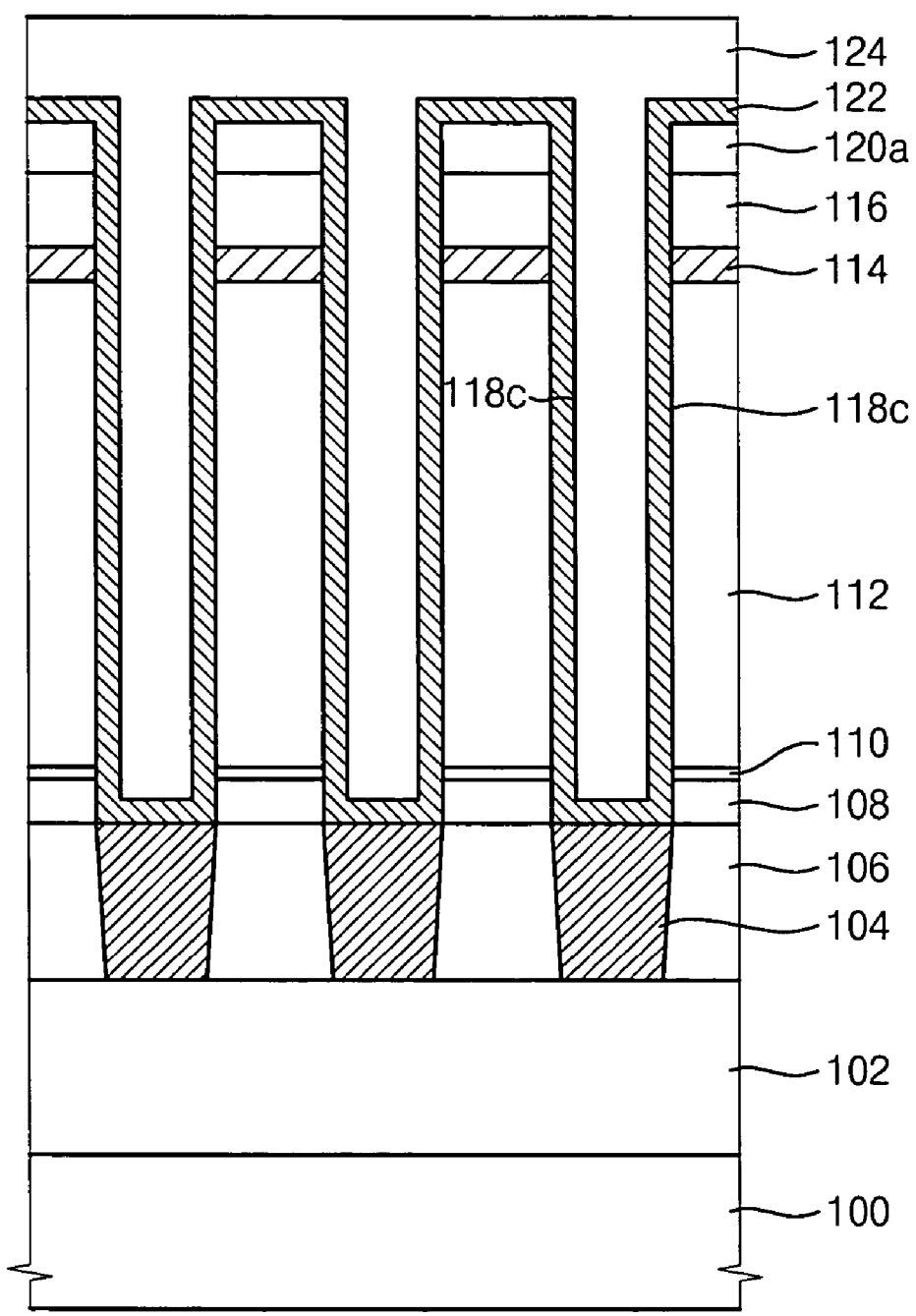
Figure 7:
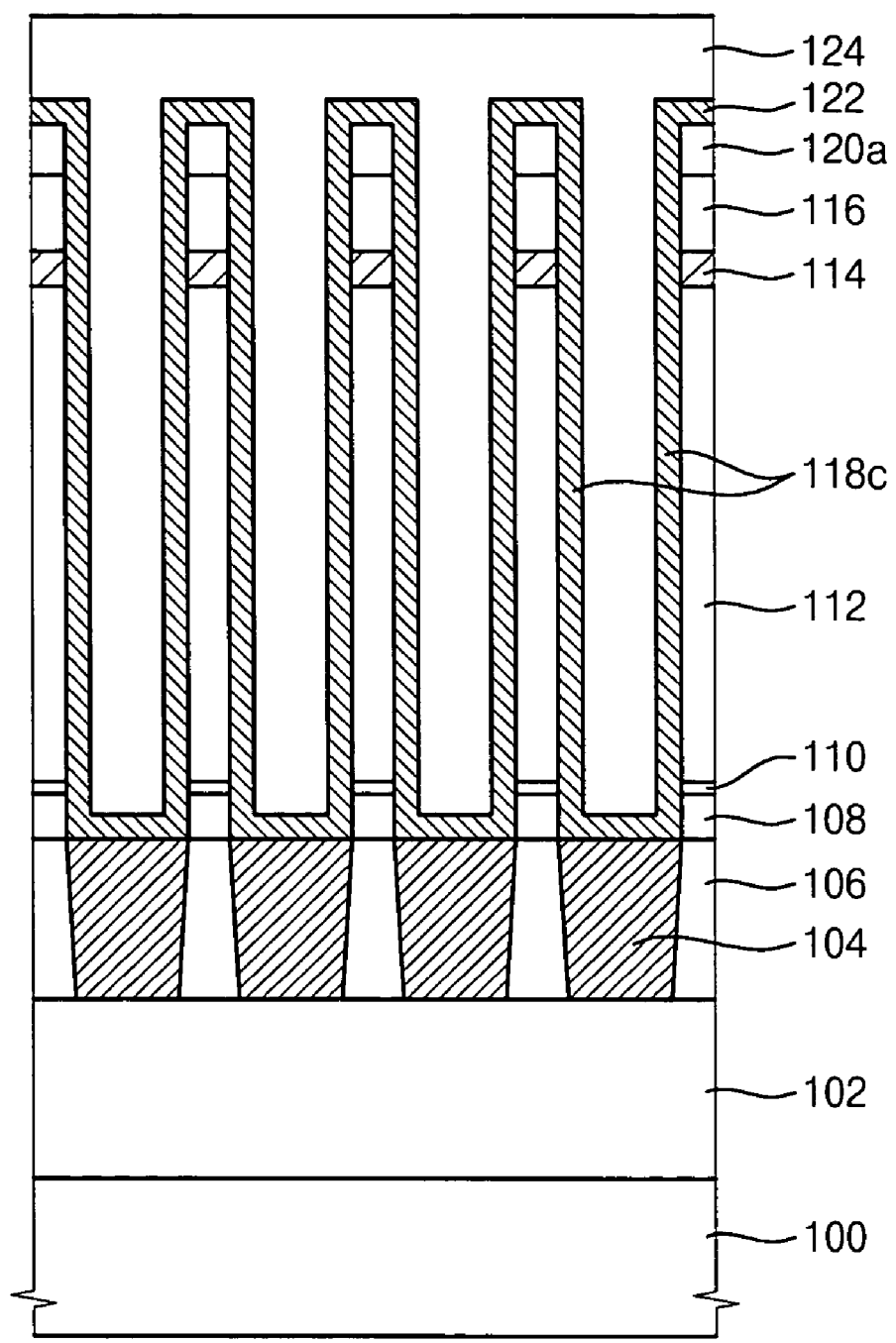

FIGS. 6 and 7 are cross-sectional views illustrating the formation of a conductive layer 122 in the openings 118 and a first sacrificial layer 124 on the conductive layer 122.

Referring to FIGS. 6 and 7, to form the desired storage electrodes illustrated in FIG. 9, a conductive layer 122 may be formed in the openings 118 on the contact structures 104, the sidewalls 118c of the first openings 118 and the mask pattern 120a. The conductive layer 122 may be formed, for example, using polysilicon heavily doped with N-type impurities or P-type impurities. The conductive layer 122 may be formed by an LPCVD process so that the conductive layer 122 may have a uniform thickness. The N-type or P-type impurities may be doped into the conductive layer using, for example, an in-situ doping process, a diffusion process and/or an ion implantation process.

The first sacrificial layer 124 may be formed on the conductive layer 122, and may, together with the conductive layer 122, substantially fill up the first openings 118. The first sacrificial layer 124 may include an oxide such as HDP-CVD oxide, PE-TEOS, USG, BPSG, PSG, and/or SOG, etc. As described above, the first sacrificial layer 124 may include an oxide substantially similar to the first mold layer 112 and/or the third mold layer 116. Alternatively, the first sacrificial layer 124 may be formed using an oxide substantially different from the first mold layer 112 and/or the third mold layer 116.

The first sacrificial layer 124 may protect the storage electrodes 126 in subsequent process steps, such as, for example, planarization and etching steps which may be used to complete the storage electrodes 126. In some embodiments of the invention, the first sacrificial layer 124 may be planarized by a CMP process, an etch-back process and/or a combination of CMP and etch-back processes.

Figure 8:
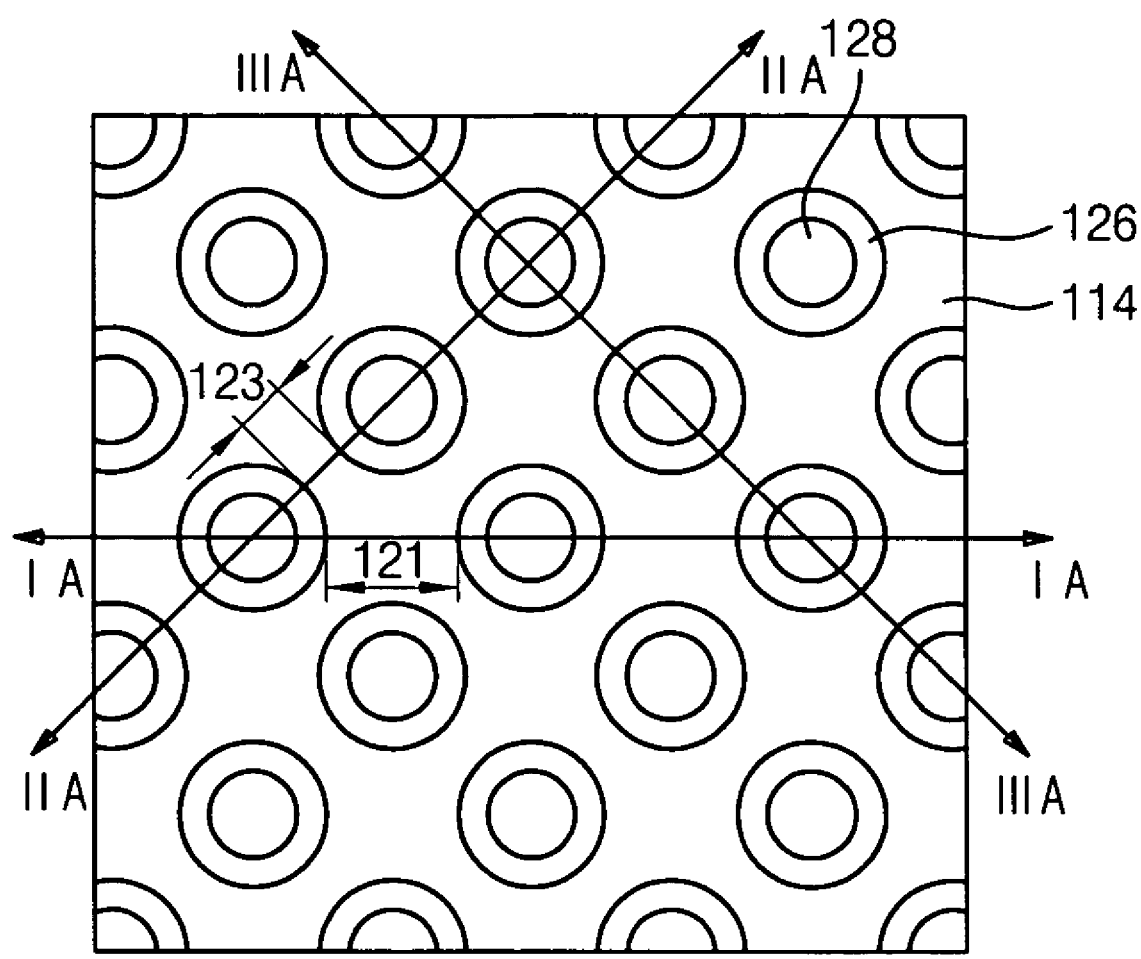

FIG. 8 is a plan view of semiconductor substrate 100 illustrating the formation of the storage electrodes 126 and the sacrificial layer patterns 128. FIG. 9 is a cross-sectional view illustrating the semiconductor substrate 100 along a line of IA-IA in FIG. 8, and FIG. 10 is a cross-sectional view illustrating the semiconductor substrate 100 along a line of IIA-IIA and/or a line IIIA-IIIA in FIG. 8.

Figure 10:
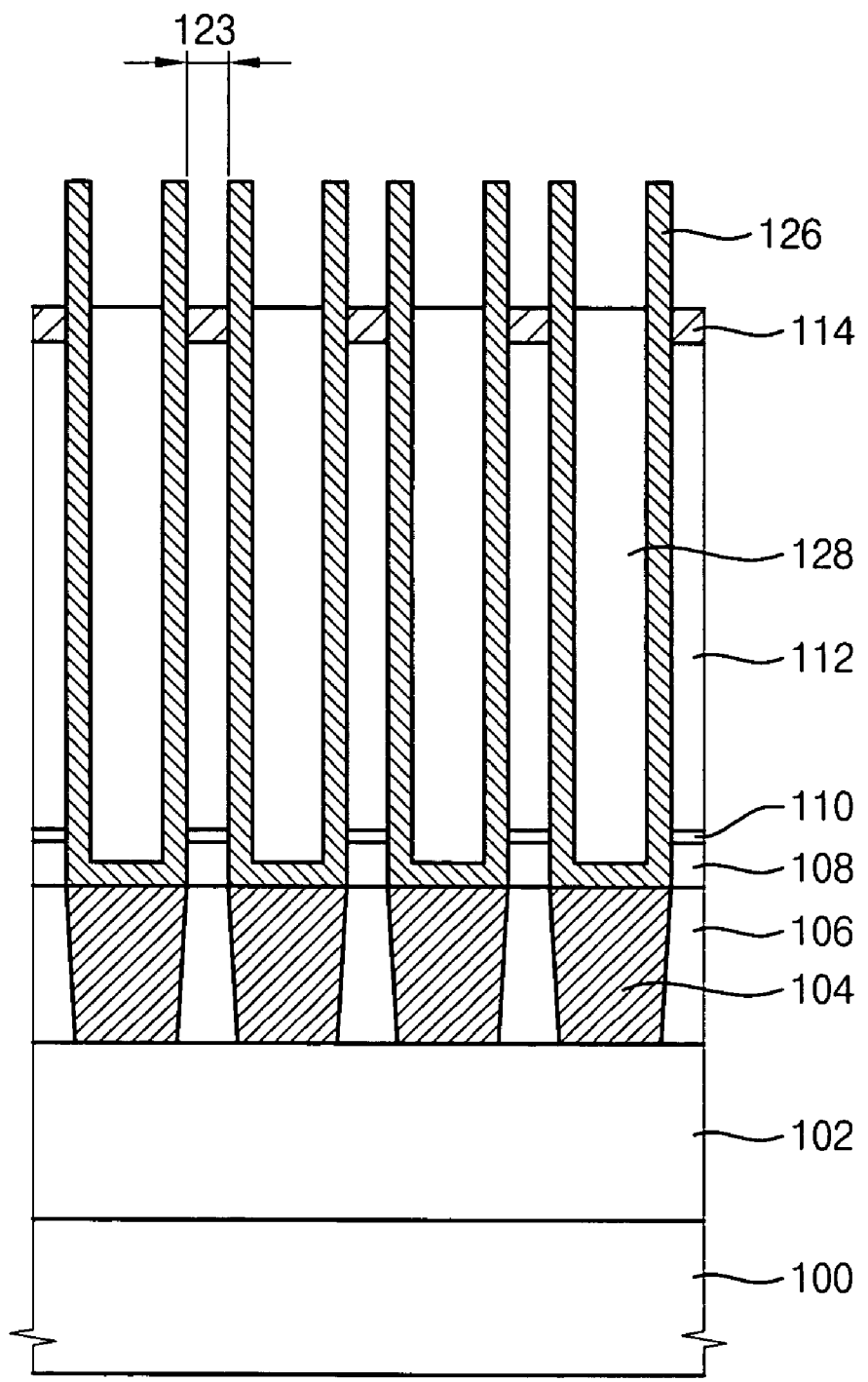

Referring to FIGS. 8 to 10, the first sacrificial layer 124 and the conductive layer 122 may be partially removed by a CMP process, an etch-back process and/or a combination of CMP and etch-back processes until the mask pattern 120a is exposed. Accordingly, the storage electrodes 126 and the sacrificial layer patterns 128 may be formed simultaneously. The storage electrodes 126 may be formed on the contact regions 104 and on the sidewalls 118c of the first openings 118. The sacrificial layer patterns 128 may, together with the storage electrodes 126, partially fill up the first openings 118. The mask pattern 120a may serve as a polishing stop layer in a CMP process when the first sacrificial layer 124 and the conductive layer 122 are partially removed by the CMP process.

The mask pattern 120a and the third mold layer 116 may then be removed until the second mold layer 114 is exposed. Thus, upper portions of the storage electrodes 126 may protrude from the second mold layer 114 and the sacrificial layer patterns 128. The mask pattern 120a may be removed using a suitable etchant such as, for example, an etchant that includes phosphoric acid. The third mold layer 116 may be removed, for example, using an etchant that includes a diluted hydrofluoric acid solution. When the mask pattern 120a and the third mold layer 116 are removed, upper portions of the sacrificial layer patterns 128 may also be removed so that the upper portions of the storage electrodes 126 may be completely exposed.

As illustrated in FIG. 8, the storage electrodes 126 may also be arranged in a regular two-dimensional matrix configuration the same or substantially the same as that of the first openings 118. The lower portions of the storage electrodes 126 may be buried in the first mold layer 112 and the second mold layer 114. Accordingly, the storage electrodes 126 may be separated by the first interval 121 along the first direction indicated as the line of IA-IA, and the storage electrodes 126 may also be separated by the second interval 123 along the second direction represented as the line of IIA-IIA or the line of III-IIIA. As described above, the first interval 121 may be substantially larger than the second interval 123.

Figure 11:
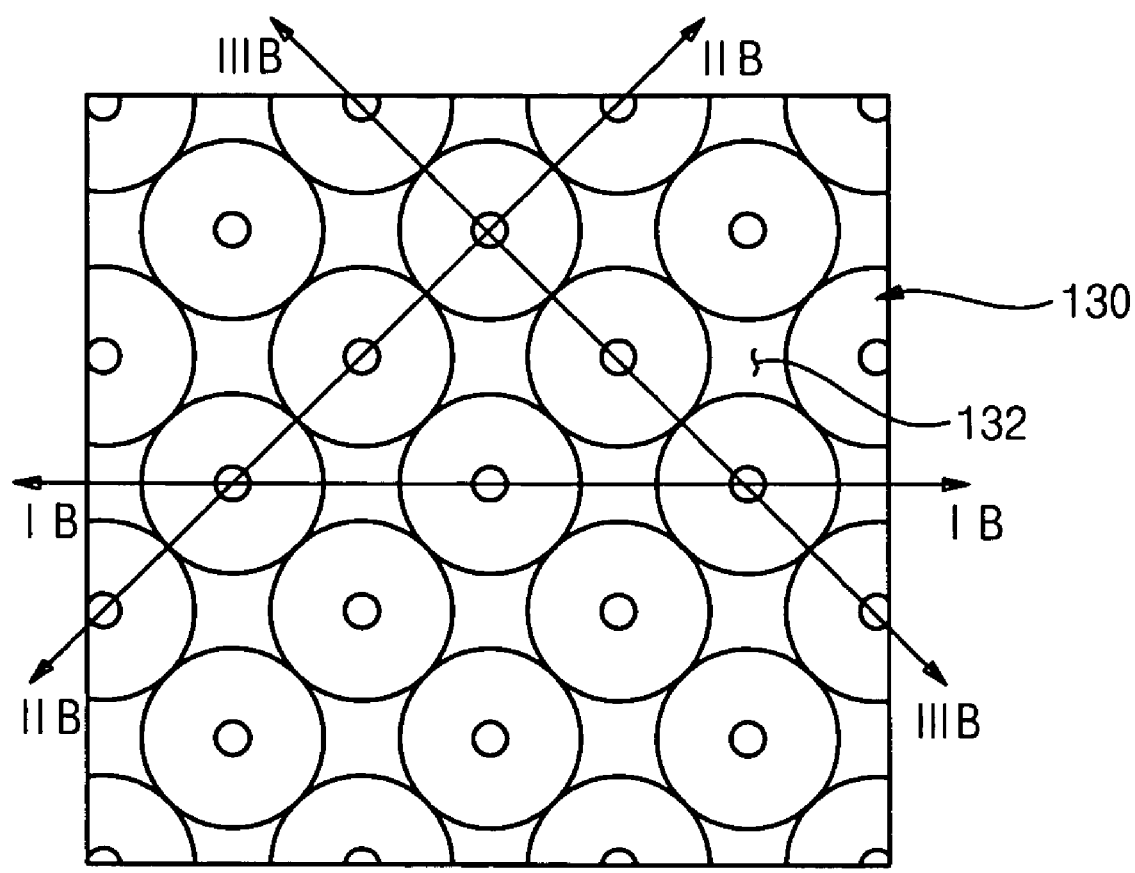
Figure 12:
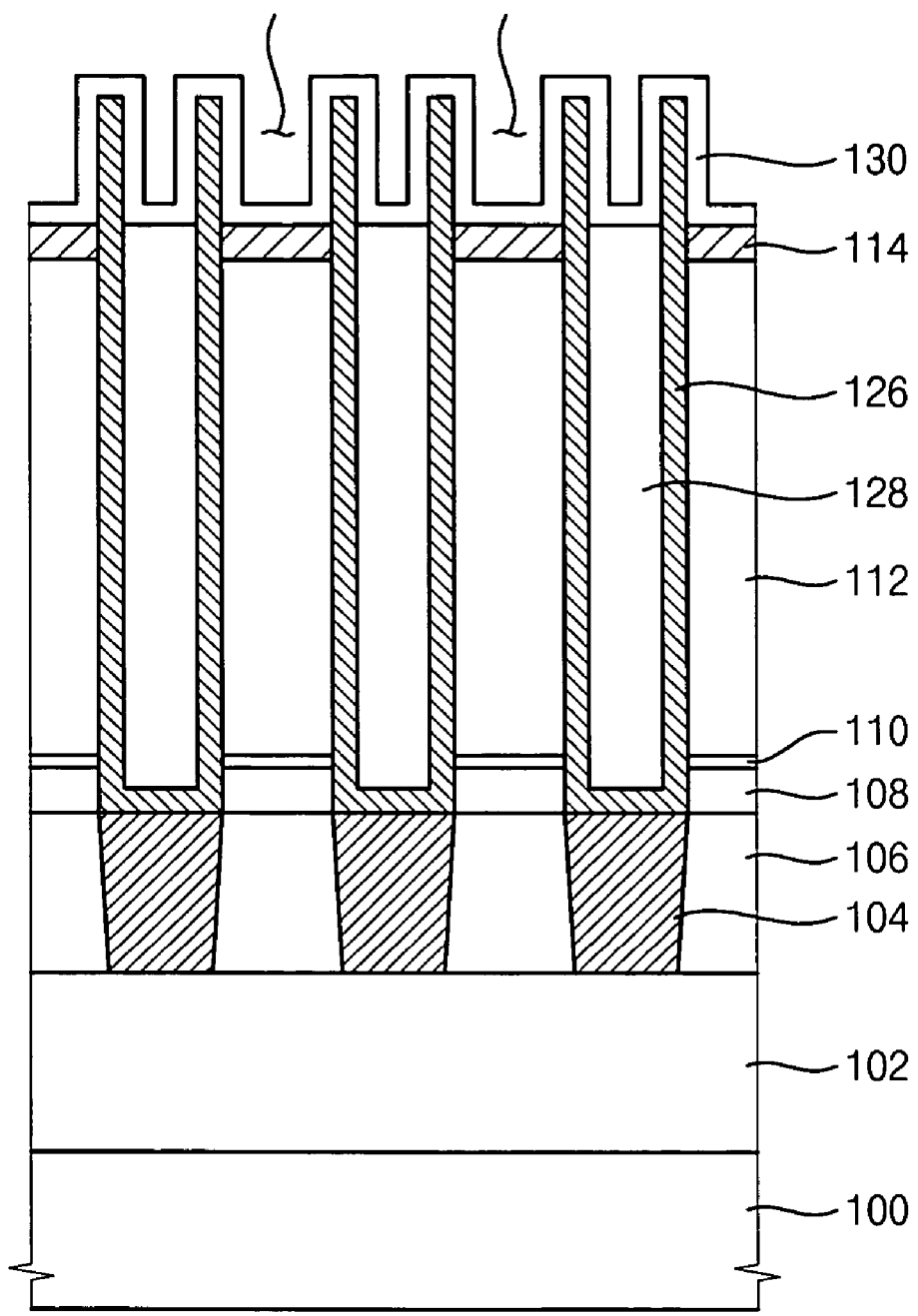

FIG. 11 is a plan view of the semiconductor substrate 100 illustrating the formation of a second sacrificial layer 130 on the storage electrodes 126. FIG. 12 is a cross-sectional view illustrating the semiconductor substrate 100 taken along a line of IB-IB in FIG. 11, and FIG. 13 is a cross-sectional view illustrating the semiconductor substrate 100 taken along a line of IIB-IIB or a line of IIIB-IIIB in FIG. 11.

Figure 13:
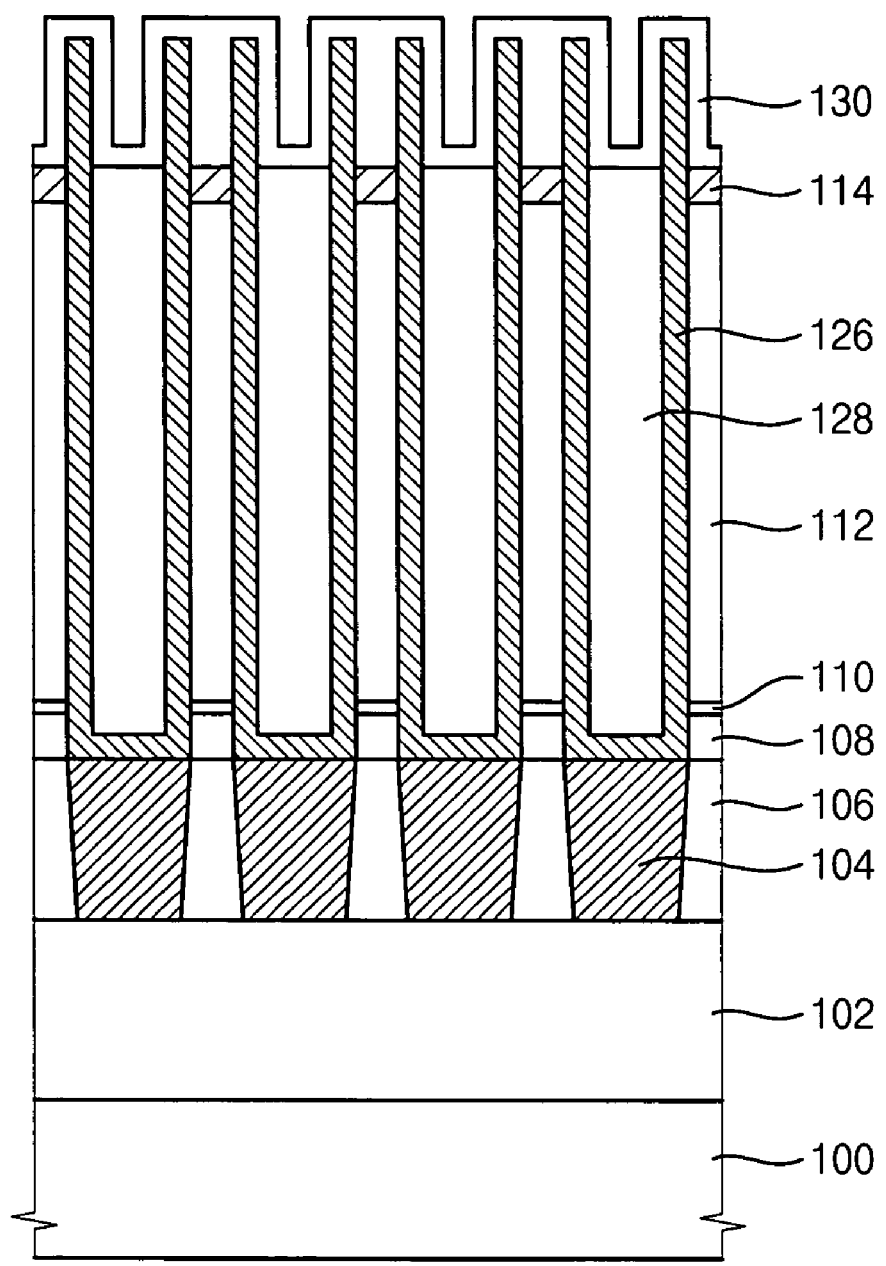

Referring to FIGS. 11 to 13, a second sacrificial layer 130 may be formed on the second mold layer 114 to cover the exposed upper portions of the storage electrodes 126 and the sacrificial layer patterns 128. The second sacrificial layer 130 may be formed using an oxide having good step coverage such as USG. For example, the second sacrificial layer 130 may be formed using an ozone ($O_3$) gas and a TEOS gas by a CVD process. Alternatively, the second sacrificial layer 130 may be formed using an ozone gas and a TEOS gas by an atmospheric pressure chemical vapor deposition (APCVD) process. The second sacrificial layer 130 may be formed at a temperature of from about 400 to about 550° C.

The second sacrificial layer 130 may completely fill up the gap between adjacent storage electrodes 126 along the second direction corresponding to the line of IIB-IIB or the line of IIIB-IIIB of FIG. 11. However, since the first interval 121 between adjacent storage electrodes 126 along the first direction is larger than the second interval 123 between adjacent storage electrodes 126 along the second direction, the second sacrificial layer 130 may not completely fill up the gap between adjacent storage electrodes 126 along the first direction corresponding to the line of IB-IB. Therefore, first recesses 132 may be formed between adjacent storage electrodes 126 along the first direction.

Figure 14:
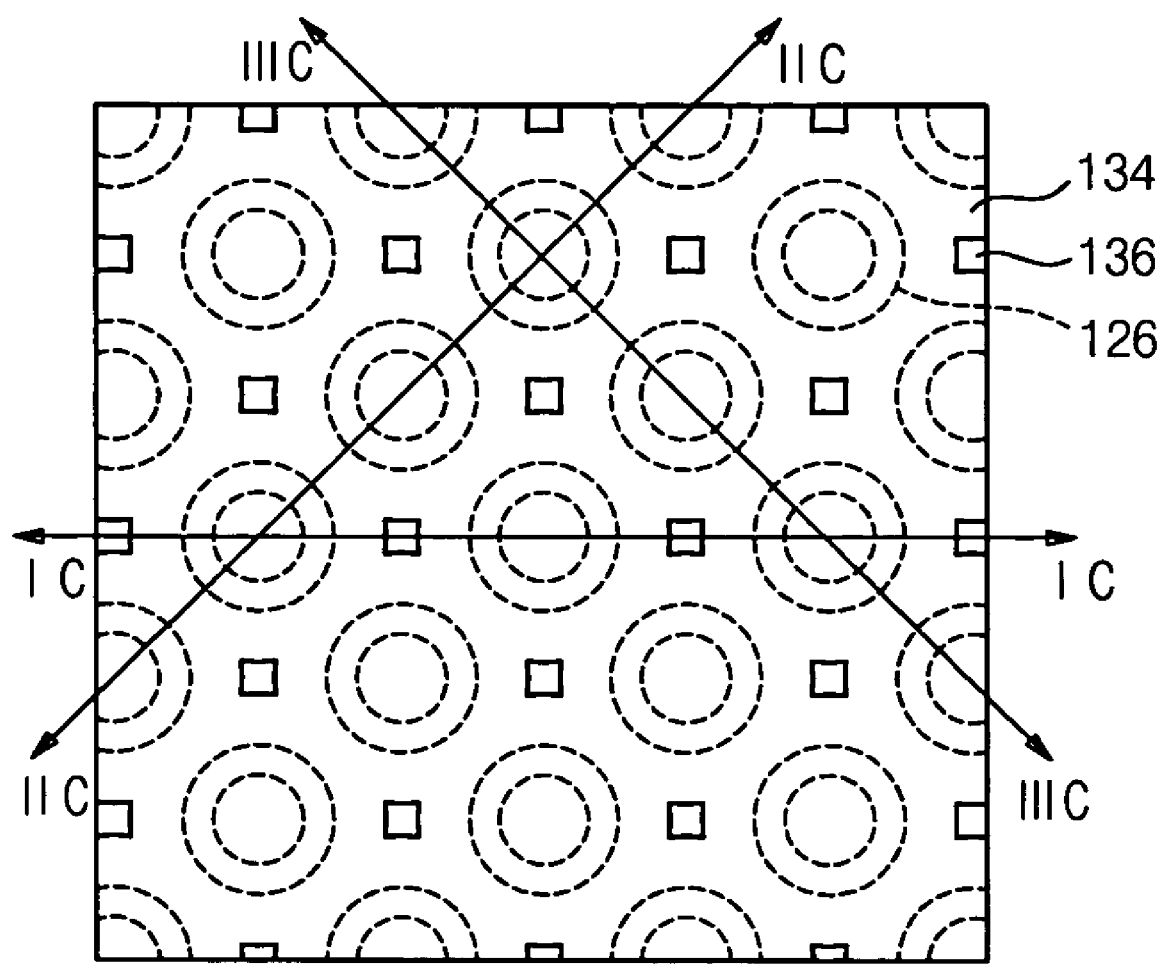
Figure 15:
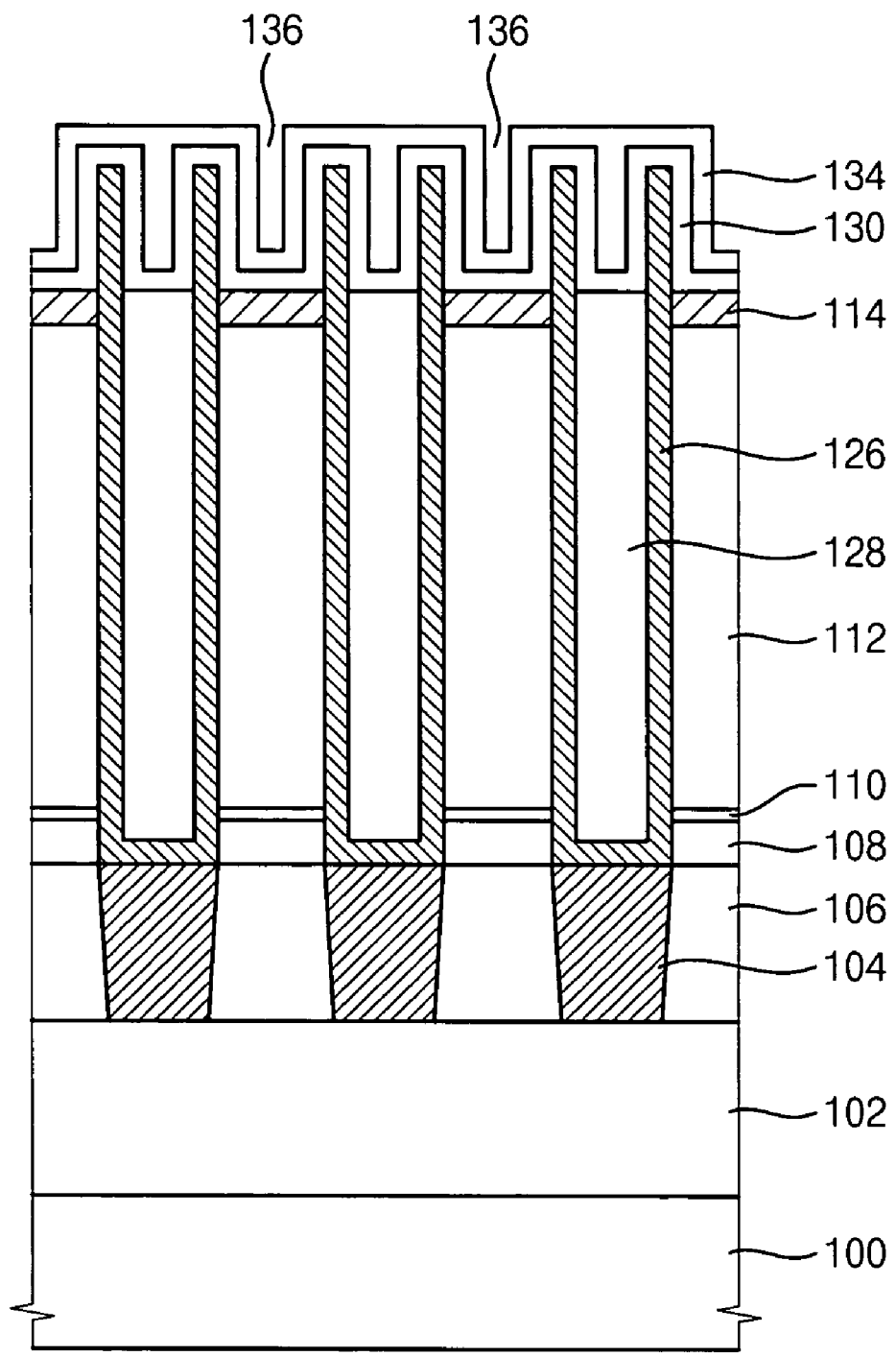

While not illustrated in FIGS. 11-13, in some embodiments, the second sacrificial layer 130 may completely fill the space within storage electrodes 126 created when the sacrificial layer patterns 128 are partially removed as described above. In some embodiments, however, the second sacrificial layer 130 may not completely fill the space within storage electrodes 126 created when the sacrificial layer patterns 128 are partially removed. Accordingly, FIG. 14 is a plan view of semiconductor substrate 100 illustrating the formation of a third sacrificial layer 134 on the second sacrificial layer 130. FIG. 15 is a cross-sectional view illustrating the semiconductor substrate 100 taken along a line of IC-IC in FIG. 14, and FIG. 16 is a cross-sectional view illustrating the semiconductor substrate 100 taken along a line of IIC-IIC or a line of IIIC-IIIC in FIG. 14.

Figure 16:
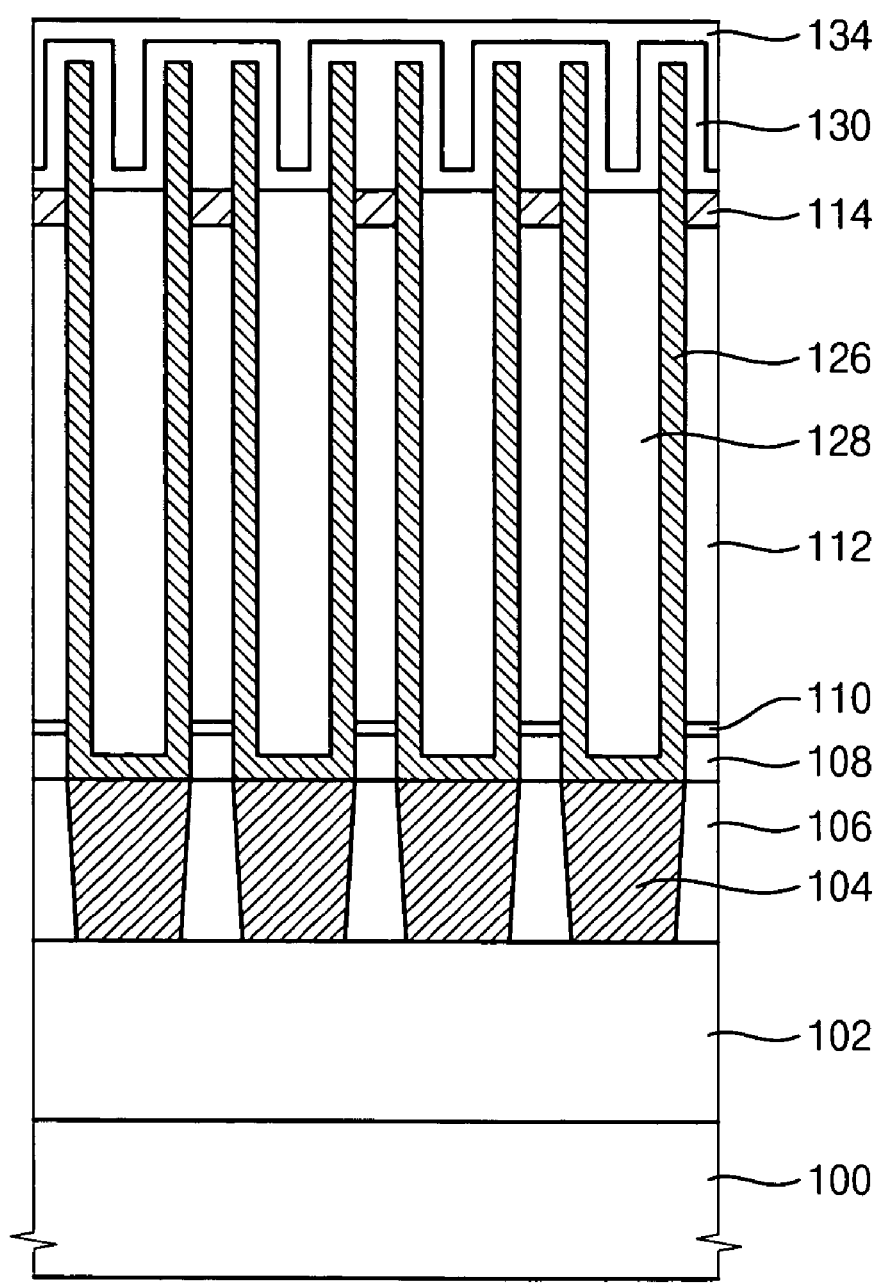

Referring to FIGS. 14 to 16, a third sacrificial layer 134 may be formed on the second sacrificial layer 130. The third sacrificial layer 134 may be formed using an oxide such as PE-TEOS. The third sacrificial layer 134 may be formed using an oxygen ($O_2$) gas and a TEOS gas by a plasma enhanced chemical vapor deposition (PECVD). The third sacrificial layer 134 may be formed at a temperature of about 400° C.

The third sacrificial layer 134 may completely fill up the space within storage electrodes 126 while not fully filling up the first recesses 132 along the first direction corresponding to the line of IC-IC. Hence, second recesses 136 may be are formed along the first direction. The second recesses 136 may have a width smaller than that of the first recesses 132. In some embodiments of the invention, the third sacrificial layer 134 covering the storage electrodes 126 may completely fill up the first recesses 132 without formation of the second recesses 136.

Figure 17:
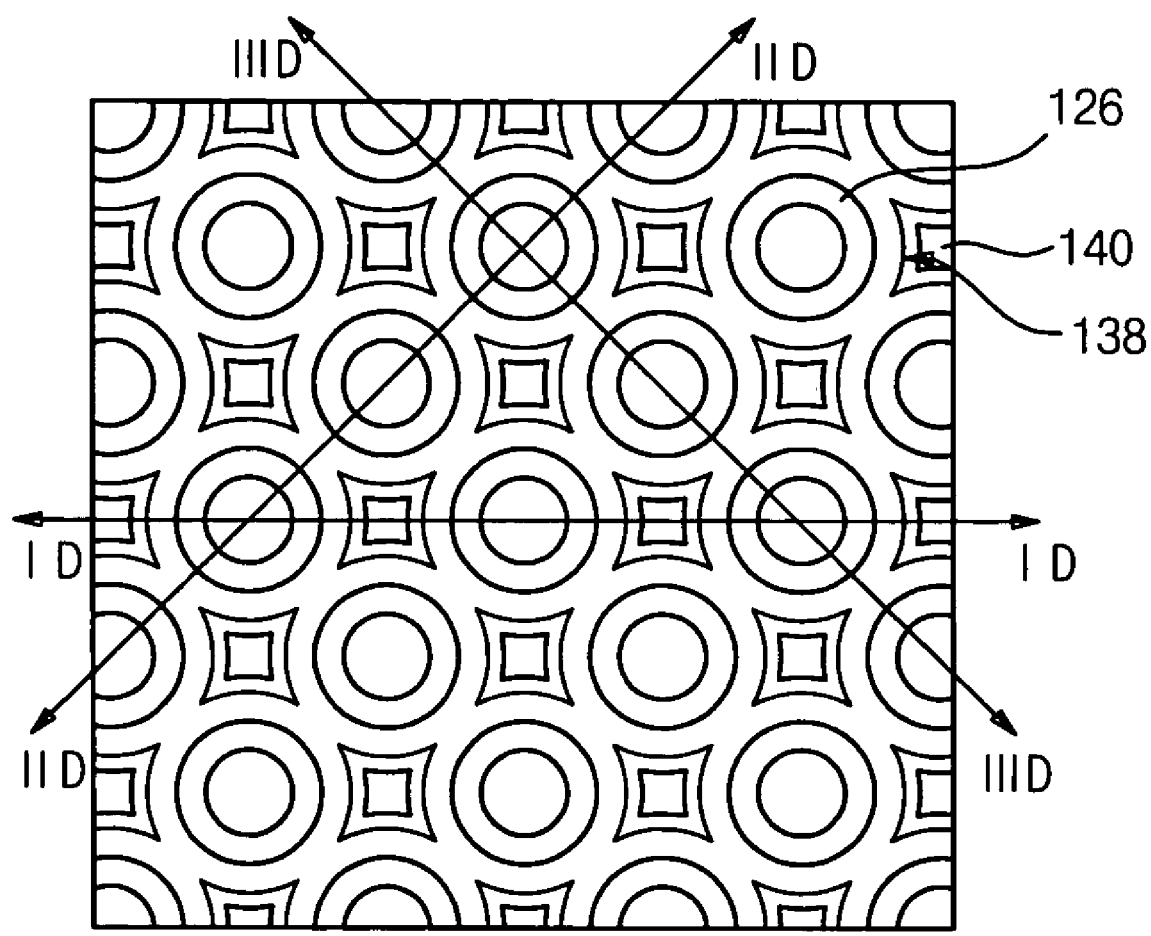
Figure 18:
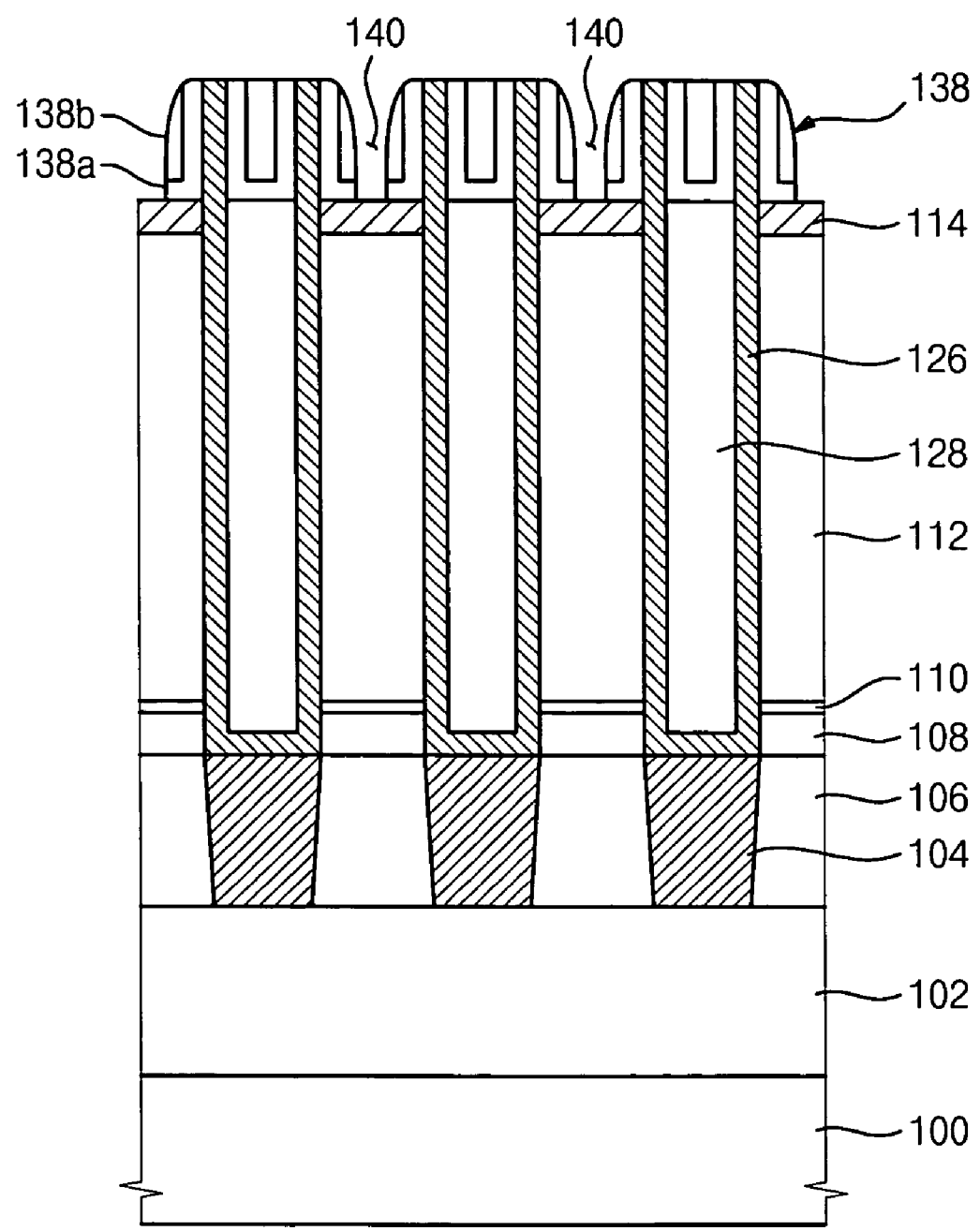

FIG. 17 is a plan view of the semiconductor substrate 100 illustrating the formation of sacrificial spacers 138 on the sides of the storage electrodes 126. FIG. 18 is a cross-sectional view illustrating the semiconductor substrate 100 taken along a line of ID-ID in FIG. 17, and FIG. 19 is a cross-sectional view illustrating the semiconductor substrate 100 taken along a line of IID-IID or a line of IIID-IIID in FIG. 17.

Figure 19:
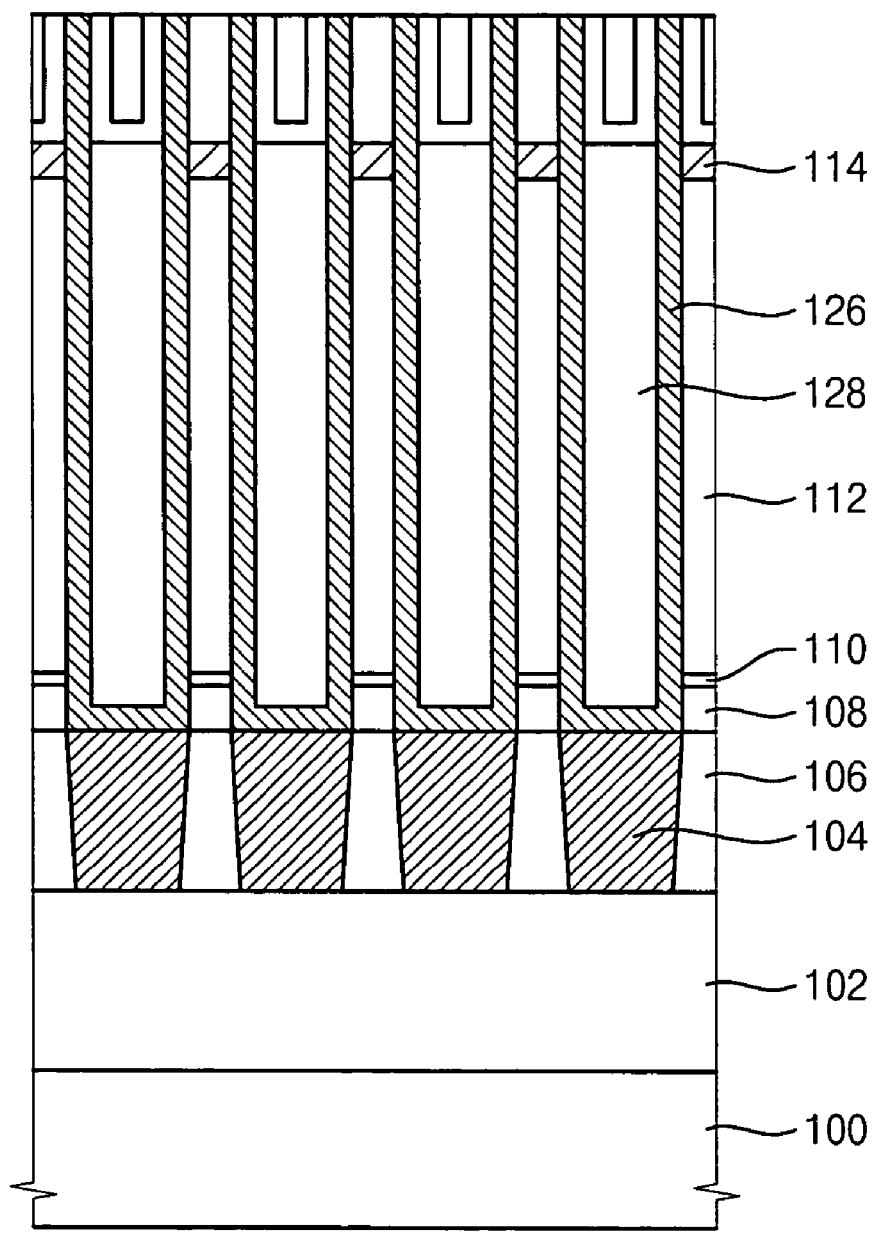

Referring to FIGS. 17 to 19, the third sacrificial layer 134 and the second sacrificial layer 130 may be anisotropically etched until the second mold layer 114 is exposed. The third sacrificial layer 134 and the second sacrificial layer 130 may be partially etched by a dry etching process. Thus, sacrificial spacers 138 may be formed on sidewalls of the upper portions of the storage electrodes 126. When the sacrificial spacers 138 are formed on the upper sidewalls of the storage electrodes 126, second openings 140 partially exposing the second mold layer 114 may be formed between adjacent sacrificial spacers 138 along the first direction, as illustrated in FIG. 18. In particular, the second openings 140 may expose the second mold layer 114 along the first direction corresponding to the line of ID-ID, whereas the second mold layer 114 may not be exposed along the second direction corresponding to the line of IID-IID or the line of IIID-IIID because the second openings 140 may not be formed in the second direction.

Figure 20:
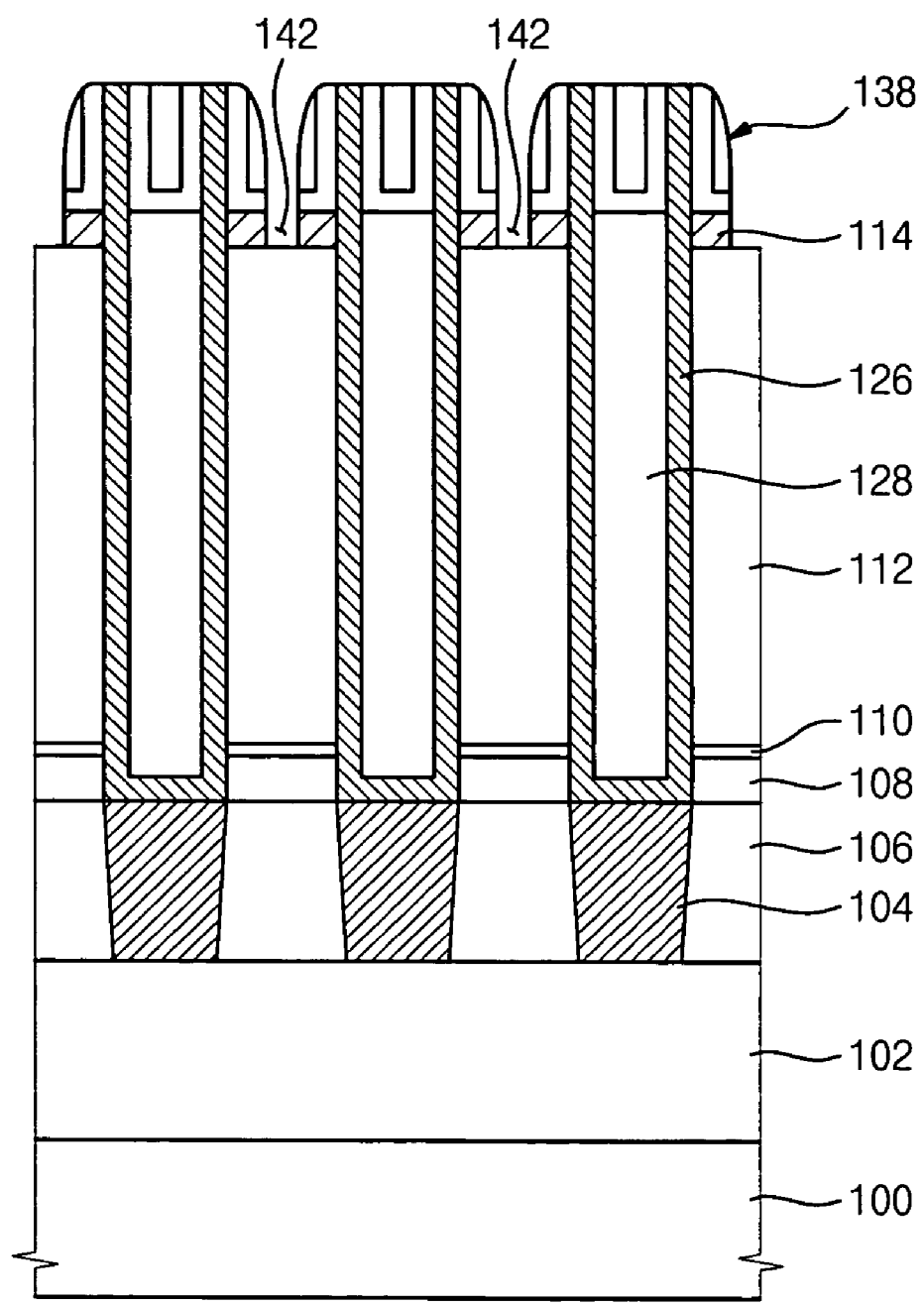

FIG. 20 is a cross-sectional view of the semiconductor substrate 100 illustrating the formation of third openings 142 through the second mold layer 114 and exposing the first mold layer 112.

Referring to FIG. 20, the second mold layer 114 exposed by the second openings 140 may be selectively etched to thereby form third openings 142 therein that expose the first mold layer 112. The third openings 142 may be formed along the first direction. In some embodiments of the invention, the second mold layer 114 may be selectively etched by an anisotropic etching process using the sacrificial spacers 138 as etching masks. In some embodiments of the invention, the second mold layer 114 may be partially etched by an isotropic etching process using an etchant that includes phosphoric acid. In some embodiments of the present invention, the third openings 142 and the second openings 140 may be formed simultaneously.

Figure 21:
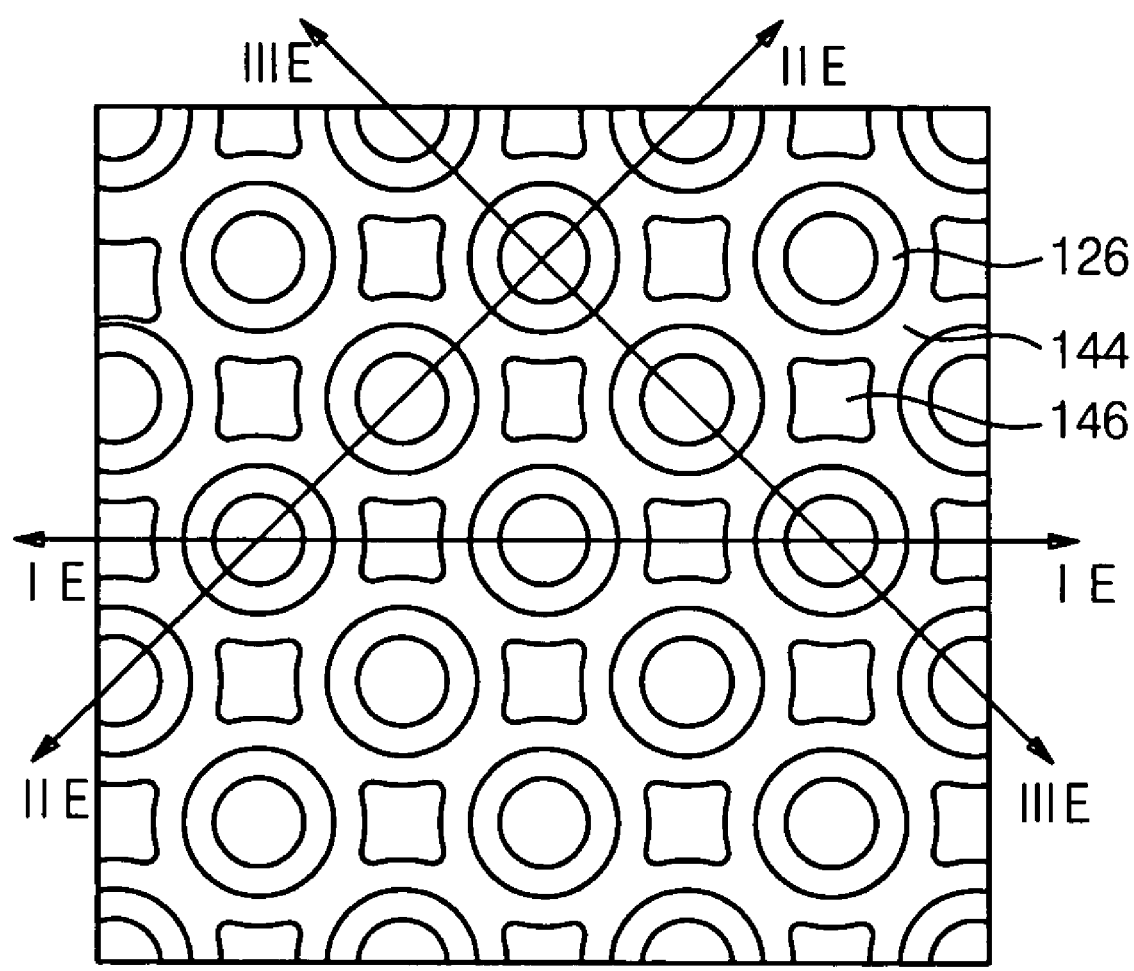
Figure 22:
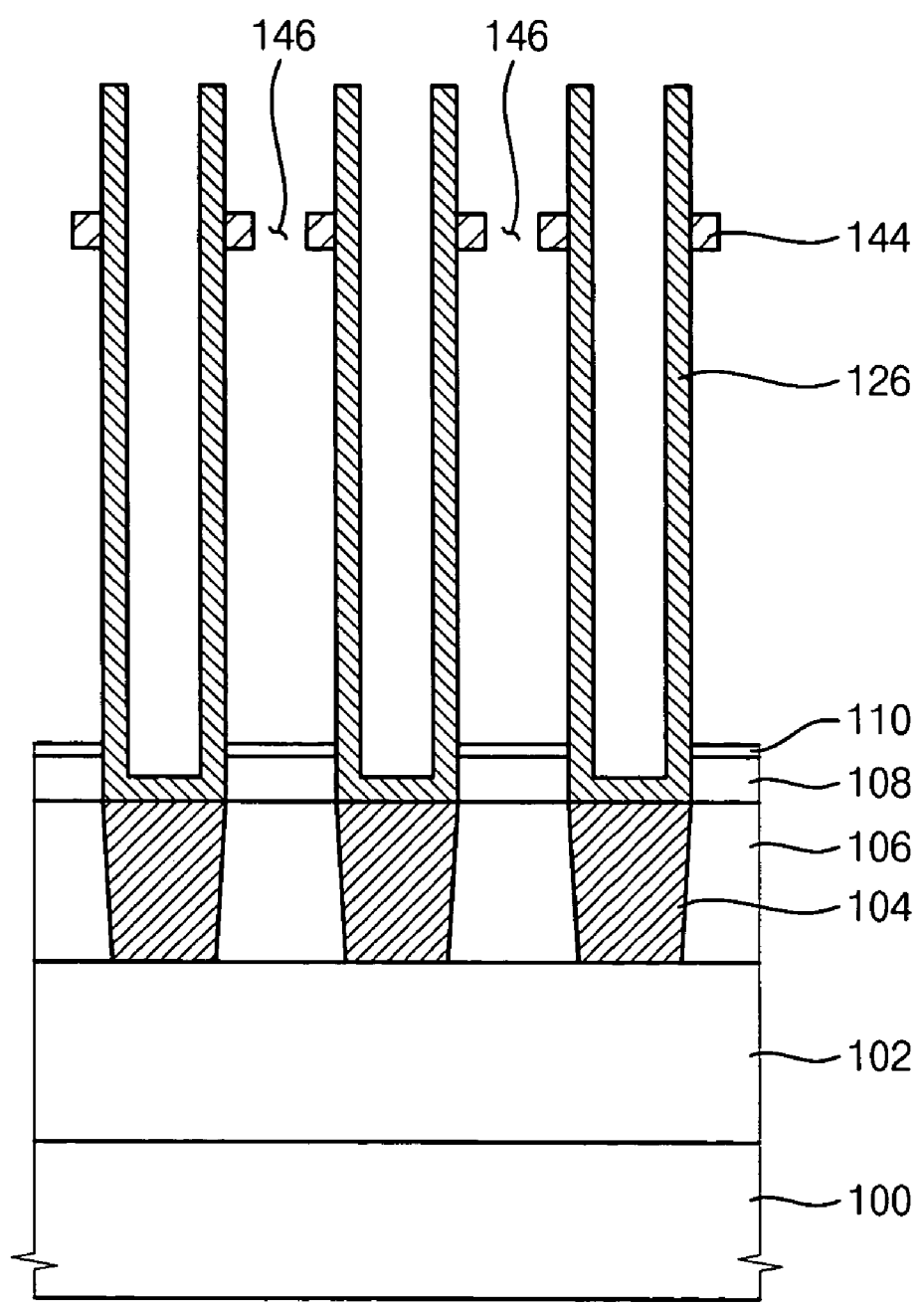

FIG. 21 is a plan view of the semiconductor substrate 100 illustrating the formation of stabilizing members 144 and completing the storage electrodes 126. FIG. 22 is a cross-sectional view illustrating the semiconductor substrate 100 taken along a line of IE-IE in FIG. 21, and FIG. 22 is a cross-sectional view illustrating the semiconductor substrate 100 taken along a line of IIE-IIE or a line of IIIE-IIIE in FIG. 22.

Figure 23:
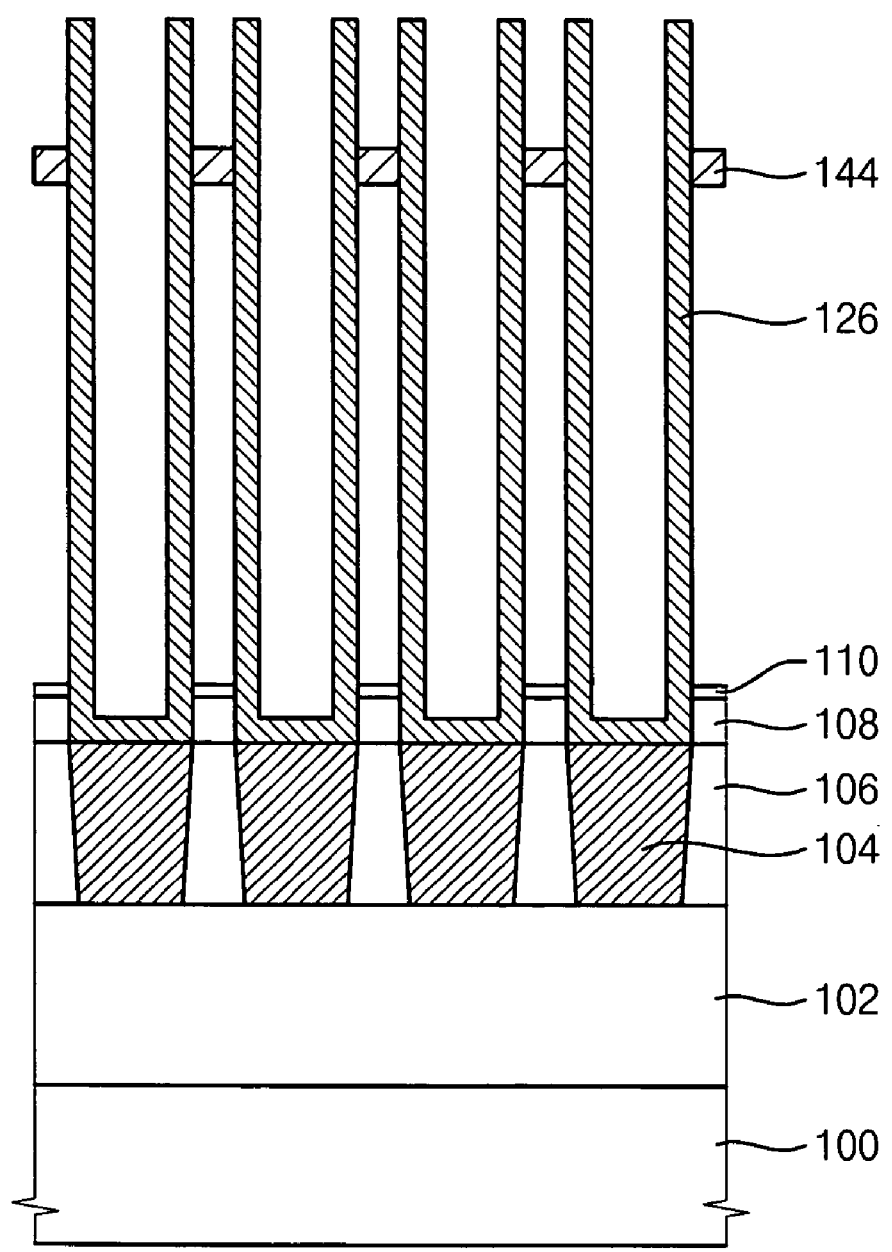

Referring to FIGS. 21 to 23, the first mold layer 112, the sacrificial layer patterns 128 and the sacrificial spacers 138 may be removed to leave stabilizing members 144 enclosing upper portions of the storage electrodes 126, respectively. Adjacent stabilizing members 144 are separated from each other along the first direction corresponding to the line of IE-IE, whereas adjacent stabilizing members 144 are connected to each other along the second direction corresponding to the line of IIE-IIE or the line of IIIE-IIIE. Since the stabilizing members 144 enclosing the storage electrodes 126 are connected in the second direction, the storage electrodes 126 may be structurally stable even though the storage electrodes 126 have extremely large heights. Accordingly, storage electrodes 126 formed in accordance with some embodiments of the invention may have improved structural stability.

During the removal of the first mold layer 112, the sacrificial layer patterns 128 and the sacrificial spacers 138, the stabilizing members 144 may be partially removed. The first mold layer 112, the sacrificial layer patterns 128 and the sacrificial spacers 138 may be removed using an etching solution that has a good etching selectivity between the material used to form such features and the material used to form the second mold layer 114 which forms the stabilizing members 144. In some embodiments, for example in embodiments in which the first mold layer 112, the sacrificial layer patterns 128 and the sacrificial spacers 138 include an oxide and the second mold layer 114 includes a nitride, the etching solution may include a diluted hydrofluoric acid solution.

As illustrated in FIG. 21, the stabilizing members 144 may be arranged in a mesh shape. In a unit cell of the semiconductor device, respective ones of the stabilizing members 144 may be connected to one another along the second direction, whereas through holes 146 may be formed between adjacent stabilizing members 144 along the first direction. Therefore, some or all of the storage electrodes 126 in the unit cell of the semiconductor device may be stably supported by the stabilizing members 144.

The spacers 138 may have a composite structure including a USG portion 138a formed during the formation of second sacrificial layer 30 and a PE-TEOS portion 138b formed during the formation of third sacrificial layer 134. A composite structure may have improved characteristics compared to a layer formed of USG and/or PE-TEOS alone. For example, although USG has good step-coverage, when a USG layer is formed on the upper portions of the storage electrodes 126, the sacrificial layer patterns 128 and the second mold layer pattern 114 by an APCVD process, the USG layer may have an irregular thickness due to the loading effect. The loading effect is a deposition characteristic that causes the uniformity of a layer deposited on a substrate to vary as a result of variations in the surface profile of the substrate on which the layer is deposited. Thus, the loading effect may cause the thickness uniformity of the USG layer to be poor. When sacrificial spacers 138 are formed by partially etching a single USG layer having poor thickness uniformity, the sacrificial spacers 138 may vary in thickness. In particular, the difference in thickness between a central sacrificial spacer 138 and an edge sacrificial spacer 138 in the unit cell may be increased. When thickness differences of the sacrificial spacers 138 occur, the third openings 142 may also have different sizes, thereby causing the stabilizing members 144 in the unit cell to be irregular.

Likewise, when a single PE-TEOS layer (that is almost free of the loading effect) is formed on the upper portions of the storage electrodes 126, the sacrificial layer patterns 128 and the second mold layer 114, using a PECVD process, voids or seams due to a substantially poor step coverage of the single PE-TEOS layer may be generated in the single PE-TEOS layer. In particular, voids or seams may be formed in the single PE-TEOS layer along the second direction, in which spaces between adjacent storage electrodes 126 have a narrower width and correspondingly higher aspect ratios. When voids or seams are generated in the single PE-TEOS layer along the second direction, the second mold layer 114 may be partially exposed along the second direction in the etching process of forming the sacrificial spacers 138. The exposed portions of the second mold layer 114 may be removed along the second direction in the etching process of exposing the first mold layer 112. After the portions of the second mold layer 114 exposed along the second direction are removed, the second mold layer 114 may be etched to form a stabilizing member 144. As a result, the stabilizing member 144 may have an irregular shape. If the shape of the stabilizing member 144 is irregular, the ability of the stabilizing member to stabilize the storage electrodes 126 may be compromised. That is, the stabilizing members 144 may not be connected to one another along the second direction, thereby permitting the storage electrodes 126 to fall down.

However, according to some embodiments of the invention, since a second sacrificial layer 130 formed of USG having substantially good step coverage and a third sacrificial layer 134 formed of PE-TEOS that is almost free of the loading effect are sequentially formed on the upper portions of the storage electrodes 126, the sacrificial layer patterns 128 and the second mold layer 114, all of the stabilizing members 144 may have uniform structures. Therefore, the structural stability of the storage electrodes 126 may be improved.

Figure 24:
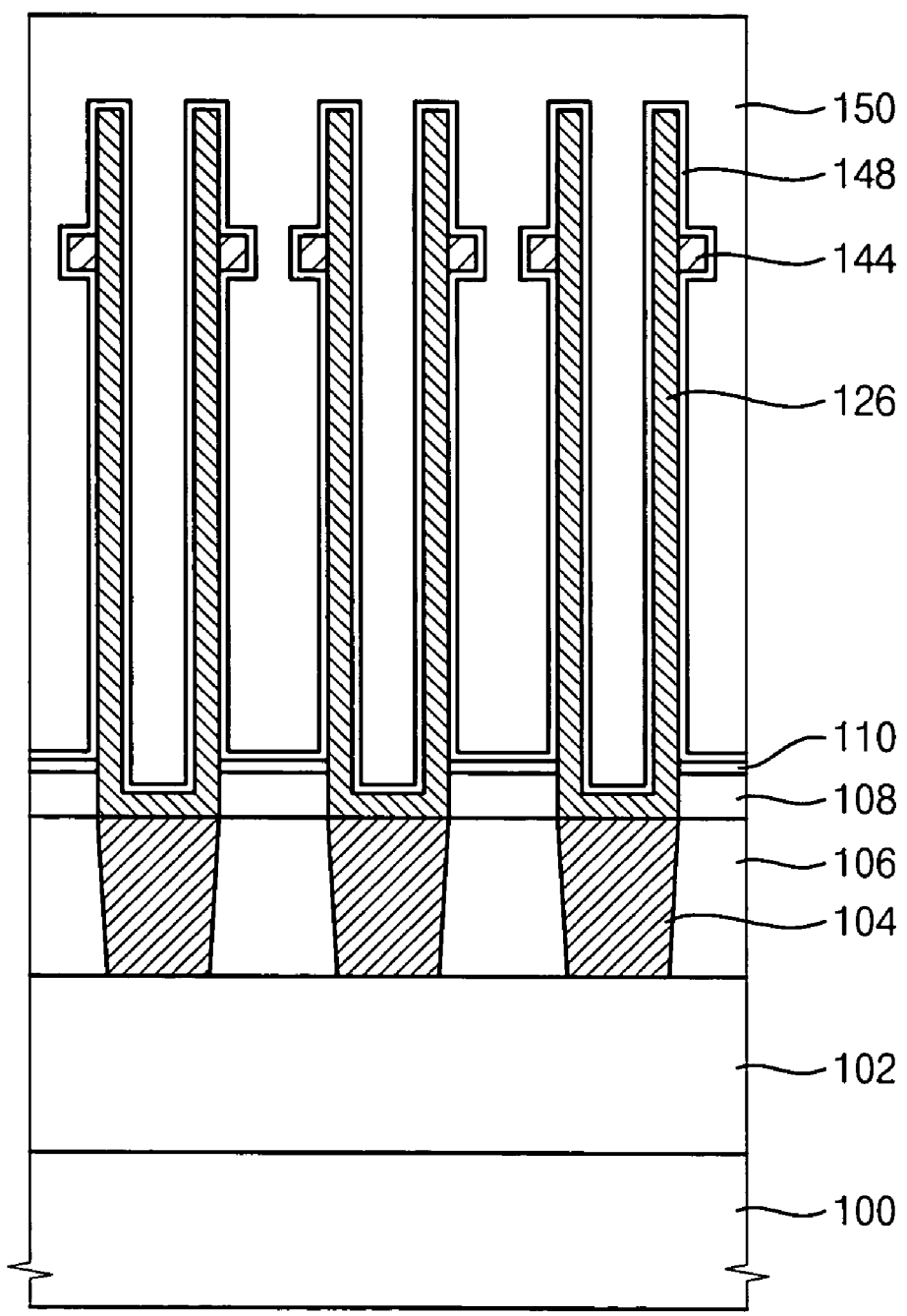
Figure 25:
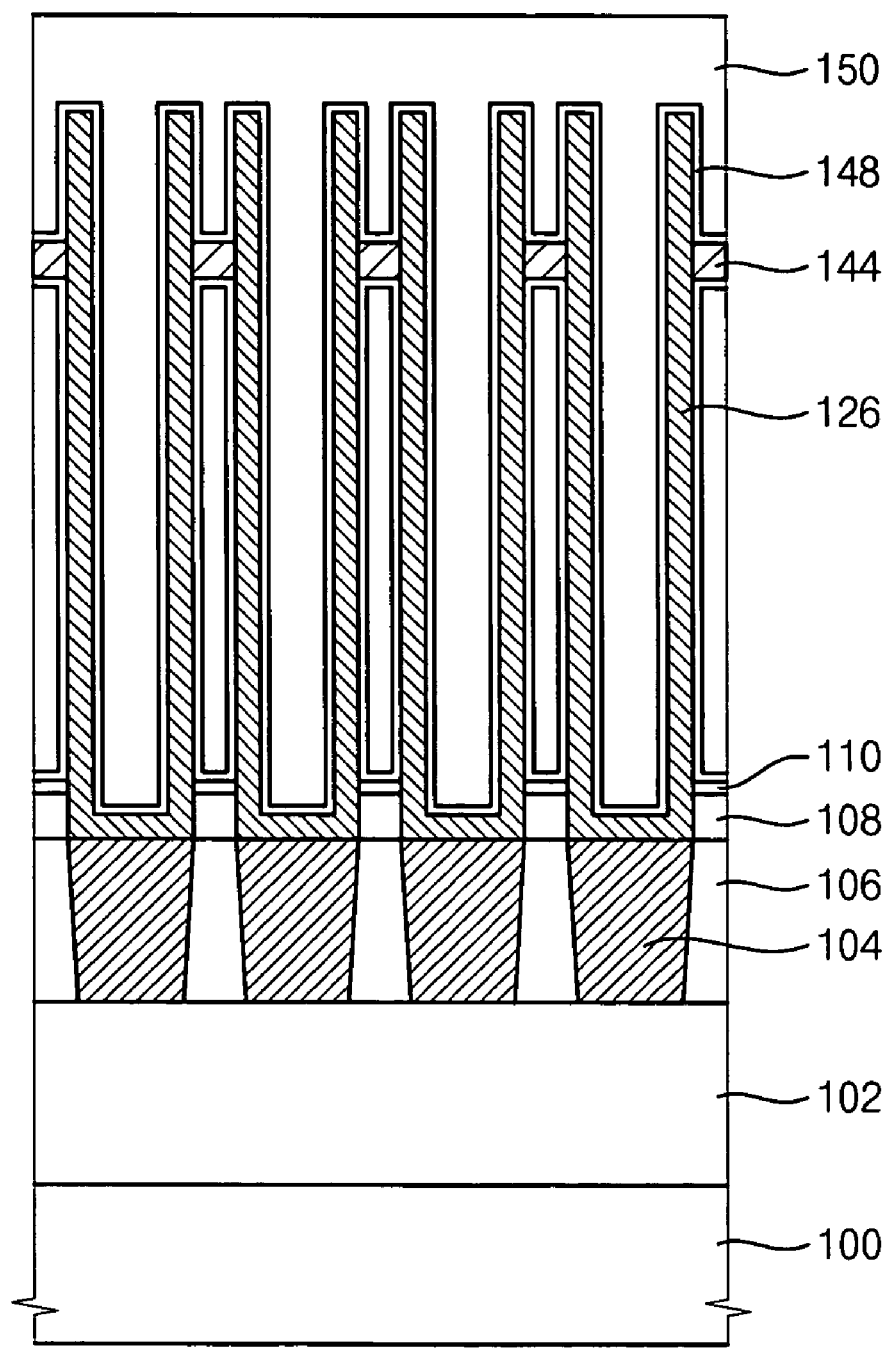

FIGS. 24 and 25 are cross-sectional views of the semiconductor substrate 100 illustrating completed capacitors.

Referring to FIGS. 24 and 25, a dielectric layer 148 and a plate electrode 150 may be formed sequentially on the storage electrodes 126 and the stabilizing members 144, thereby completing the capacitors over the semiconductor substrate 100. The dielectric layer 148 may be formed using a material that has a relatively high dielectric constant such as metal oxide or nitride. Alternatively, the dielectric layer 148 may be formed using an oxide such as silicon oxide. The plate electrode 150 may be formed using metal or polysilicon doped with impurities.

Figure 26:
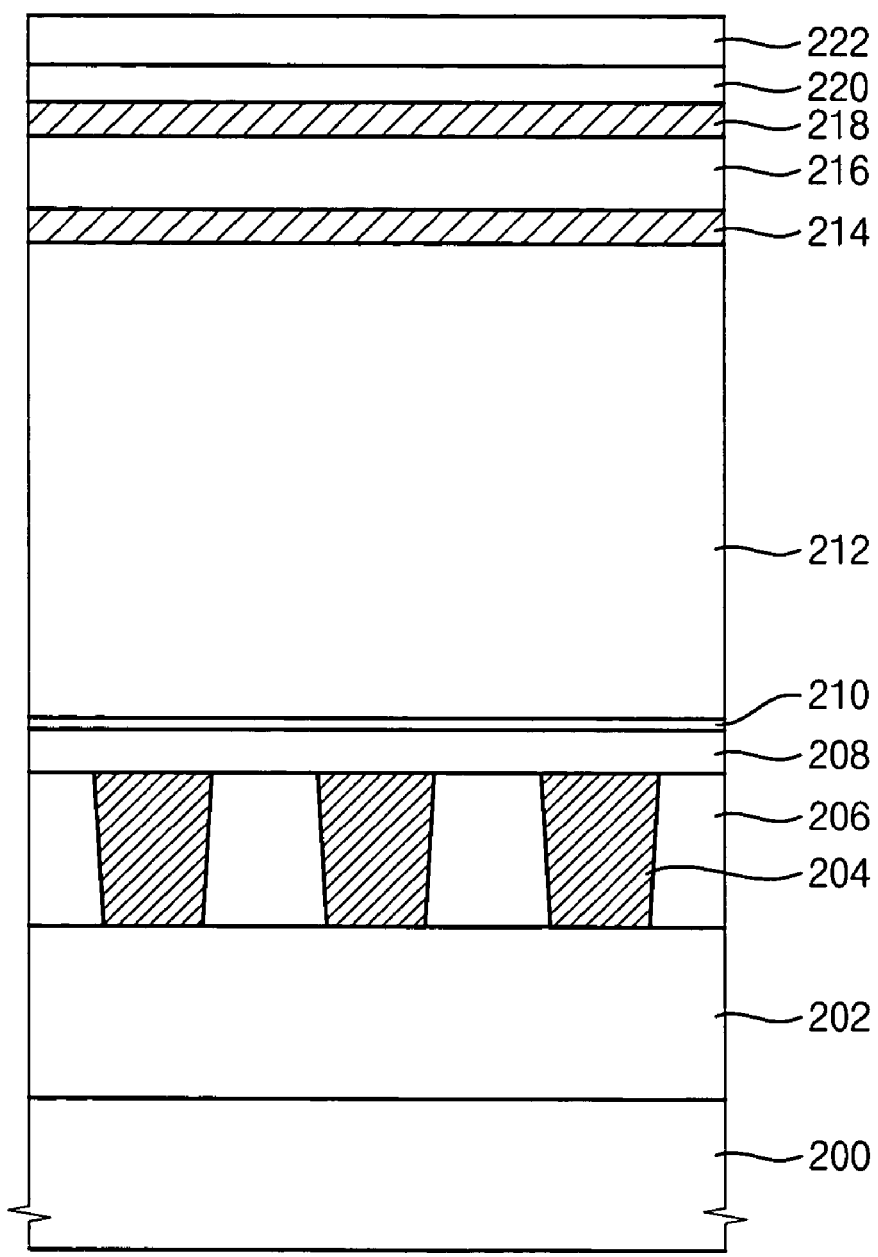
FIGS. 26 to 34 are cross-sectional views illustrating methods of manufacturing capacitors in accordance with further embodiments of the invention.

FIGS. 26 to 34 are cross-sectional views illustrating methods of manufacturing capacitors in accordance with further embodiments of the invention. In particular, FIG. 26 is a cross-sectional view of a semiconductor substrate 200 illustrating the formation of insulating interlayers 202, 206, 208, mold layers 212, 214, 216, a polishing stop layer 218, an optional buffer oxide layer 220 and a mask layer 222 thereon.

Referring to FIG. 26, a first insulating interlayer 202 may be formed on a semiconductor substrate 200. As described above, lower structures including MOS transistors may be formed between the first insulating interlayer 202 and the semiconductor substrate 200.

A second insulating interlayer 206 may be formed on the first insulating interlayer 202. Contact structures 204 may be formed through the second insulating interlayer 206. The contact structures 204 may be electrically connected with the lower structures including, for example, the MOS transistors.

A third insulating interlayer 208, an etch stop layer 210, a first mold layer 212, a second mold layer 214 and a third mold layer 216 may be successively formed on the second insulating interlayer 206 and the contact structures 204.

A polishing stop layer 218, an optional buffer oxide layer 220 and a mask layer 222 may be formed sequentially on the third mold layer 216. The polishing stop layer 218 may be formed using a nitride such as silicon nitride. The polishing stop layer 218 may be used to determine the endpoint of the CMP process used for forming storage electrodes 232 (see FIGS. 33 and 34). The polishing stop layer 218 may be formed using an LPCVD process, and may have a thickness of from about 50 Å to about 1,000 Å. The optional buffer oxide layer 220 may reduce stress between the polishing stop layer 218 and the mask layer 222 that may be generated during formation of the mask layer 222.

The mask layer 222 may be formed using a material that has a good etching selectivity with respect to the polishing stop layer 218 and/or the first, second and third mold layers 212, 214 and 216. The mask layer 222 may include, for example, polysilicon. The mask layer 222 may have a thickness of from about 100 Å to about 6,000 Å measured from an upper face of the polish stop layer 218 (or, if present, the optional buffer oxide layer 220).

The third insulating interlayer 208, the etch stop layer 210 and the first, second and third mold layers 212, 214 and 216 may be formed by processes similar to those described with reference to the third insulating interlayer 108, the etch stop layer 110 and the first, second and third mold layers 112, 114 and 116 described in reference to FIGS. 2 to 25.

Figure 27:
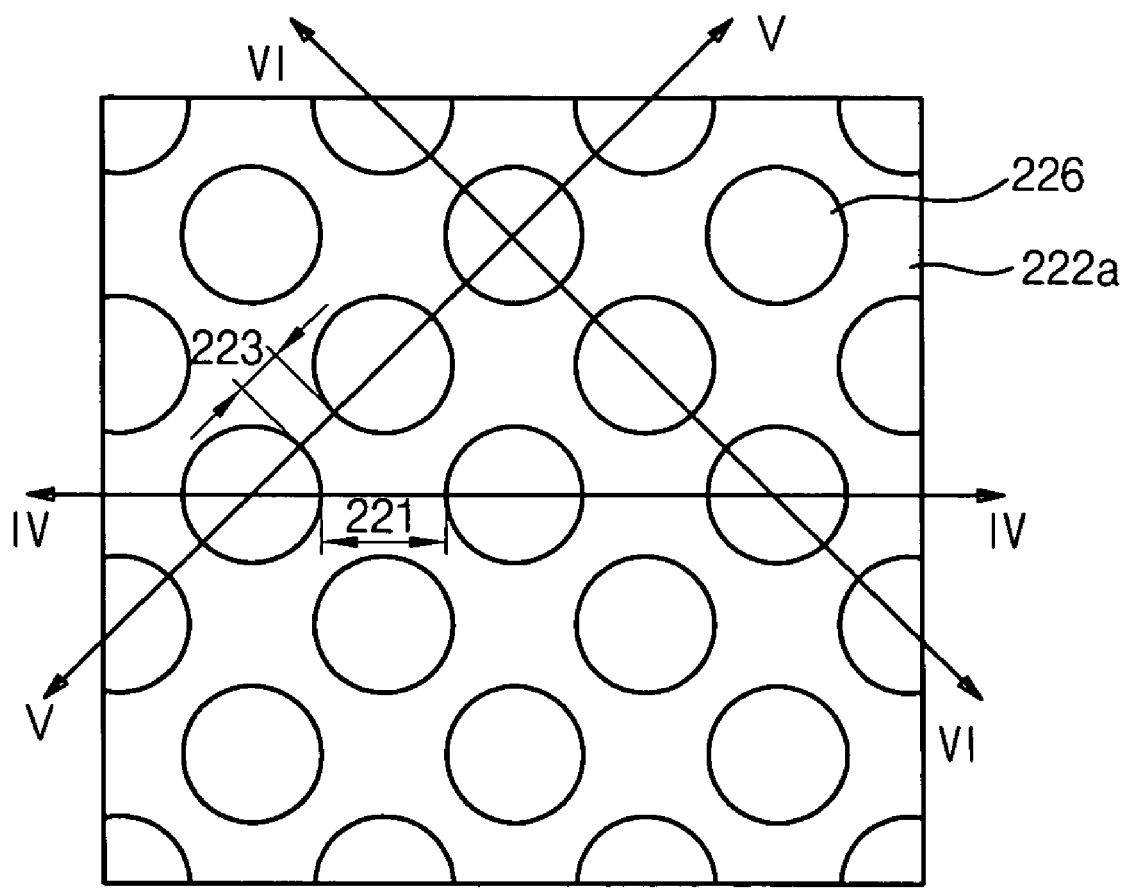
Figure 28:
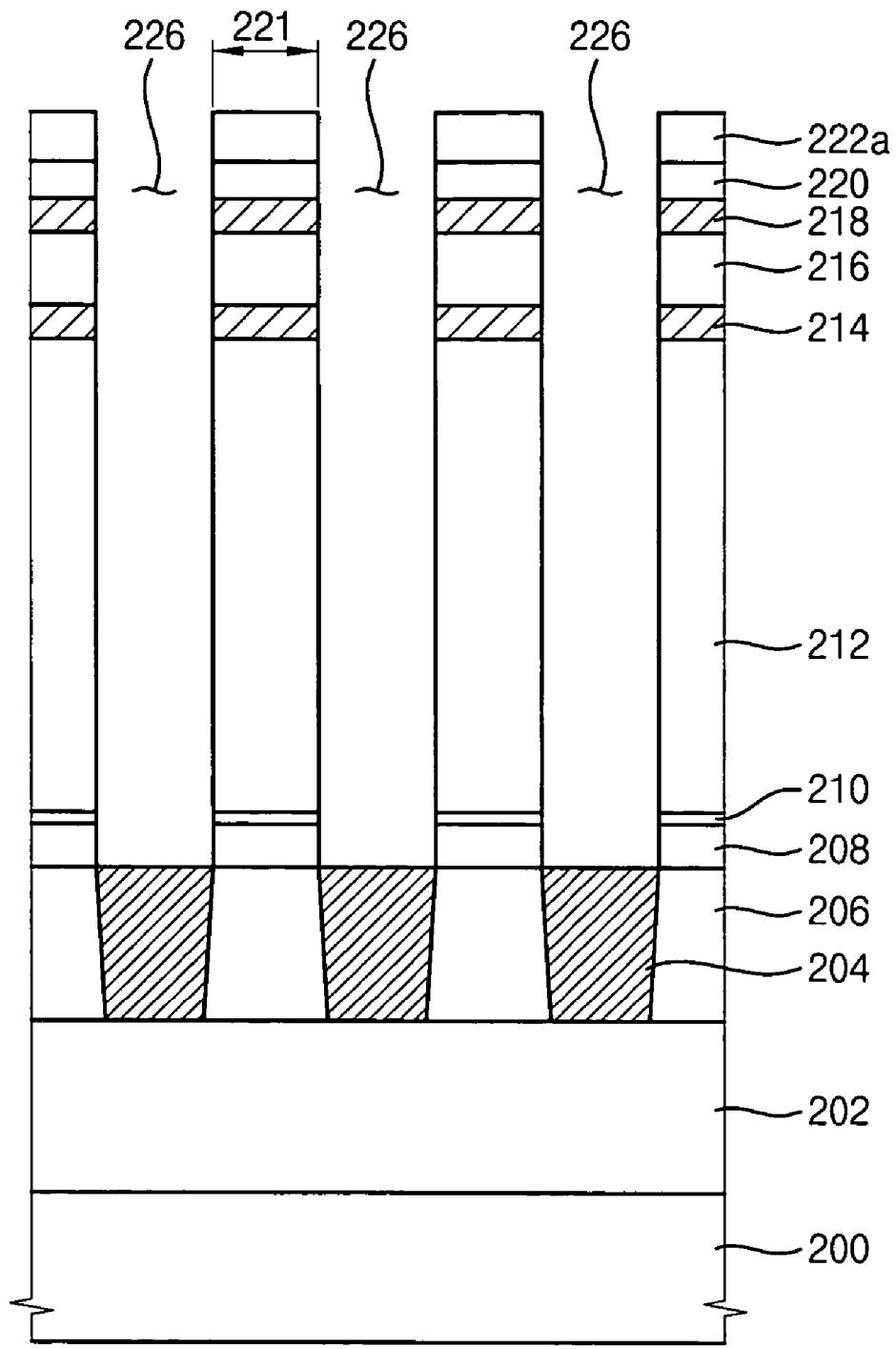

FIG. 27 is a plan view of the semiconductor substrate 200 illustrating the formation of a mask pattern 222*a* and openings 226 therein. FIG. 28 is a cross-sectional view illustrating the semiconductor substrate 200 along a line of IV-IV in FIG. 27, and FIG. 28 is a cross-sectional view illustrating the semiconductor substrate 200 along a line of V-V or a line of VI-VI in FIG. 27. In FIG. 27, the line of IV-IV is similar to the line of I-I in FIG. 3, and the lines of V-V and VI-VI are similar to the lines of II-II and III-III in FIG. 3.

Figure 29:
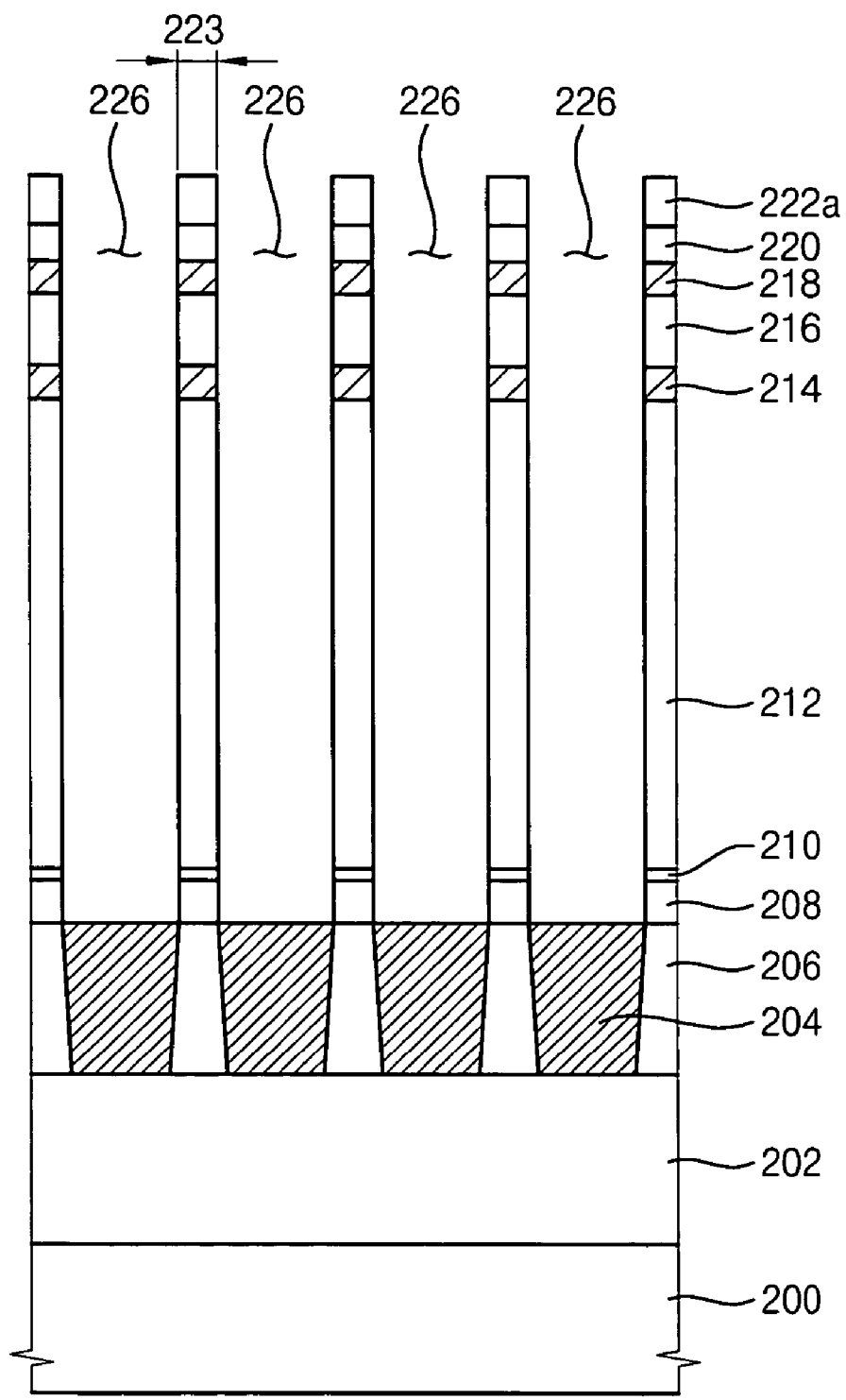

Referring to FIGS. 27 to 29, a photoresist pattern (not shown) may be formed on the mask layer 222. The mask layer 222 may be etched using the photoresist pattern as an etch mask to thereby form a mask pattern 222*a* on the buffer oxide layer 220. The photoresist pattern may then be removed from the mask pattern 222*a* by an ashing and/or a stripping process.

The buffer oxide layer 220, the polishing stop layer 218, the third mold layer 216, the second mold layer 214, the first mold layer 212, the etch stop layer 210, the third insulating interlayer 208 may be partially etched using the mask pattern 222*a* as an etching mask, thereby forming the openings 226 that expose the contact structures 204.

As described above, adjacent openings 226 are separated from each other by the first interval 221 along the first direction corresponding to the line of IV-IV, whereas adjacent openings 226 are spaced apart from each other by the second interval 223 along the second direction corresponding to the line of V-V or VI-VI.

Figure 30:
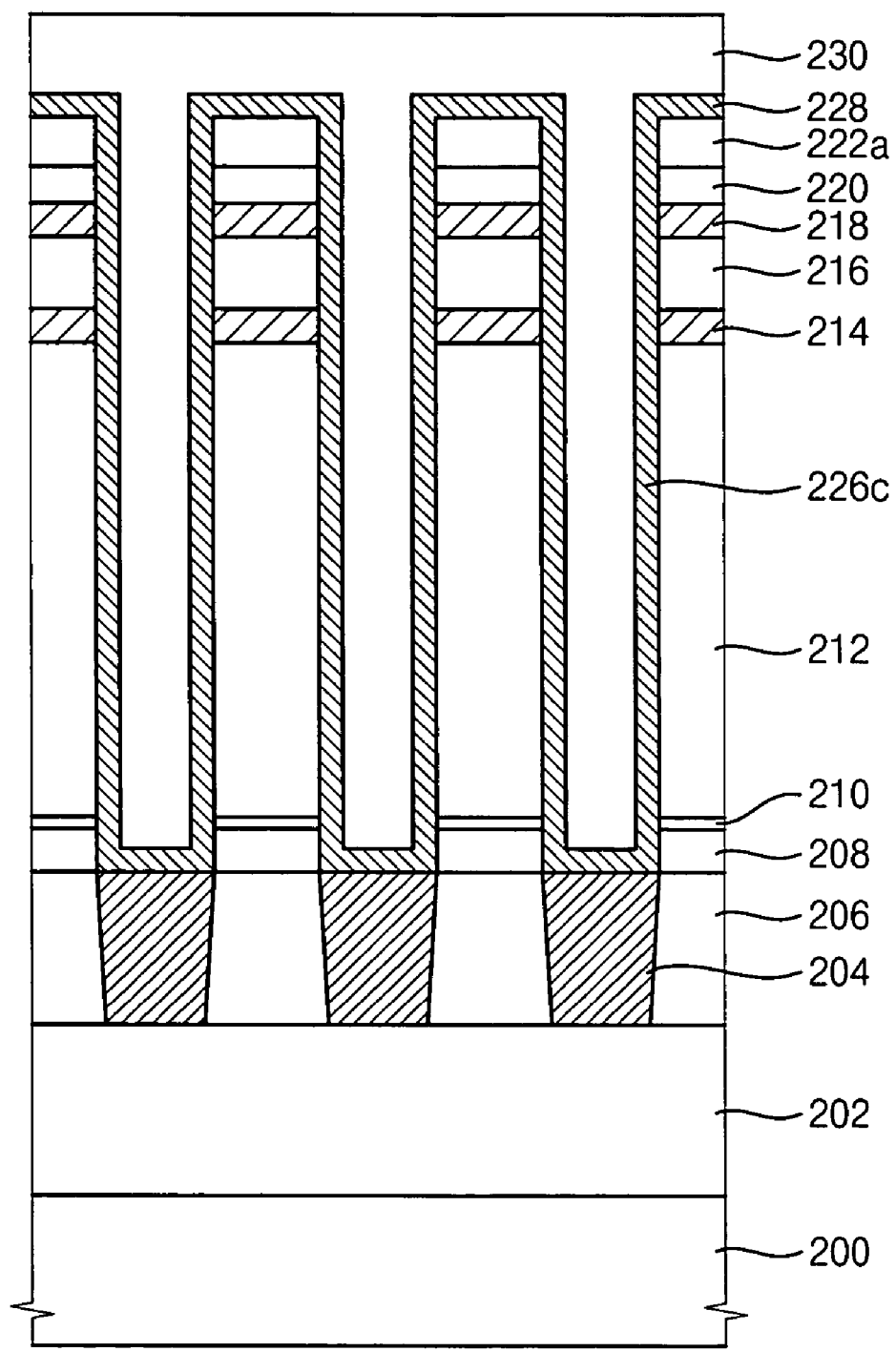
Figure 31:
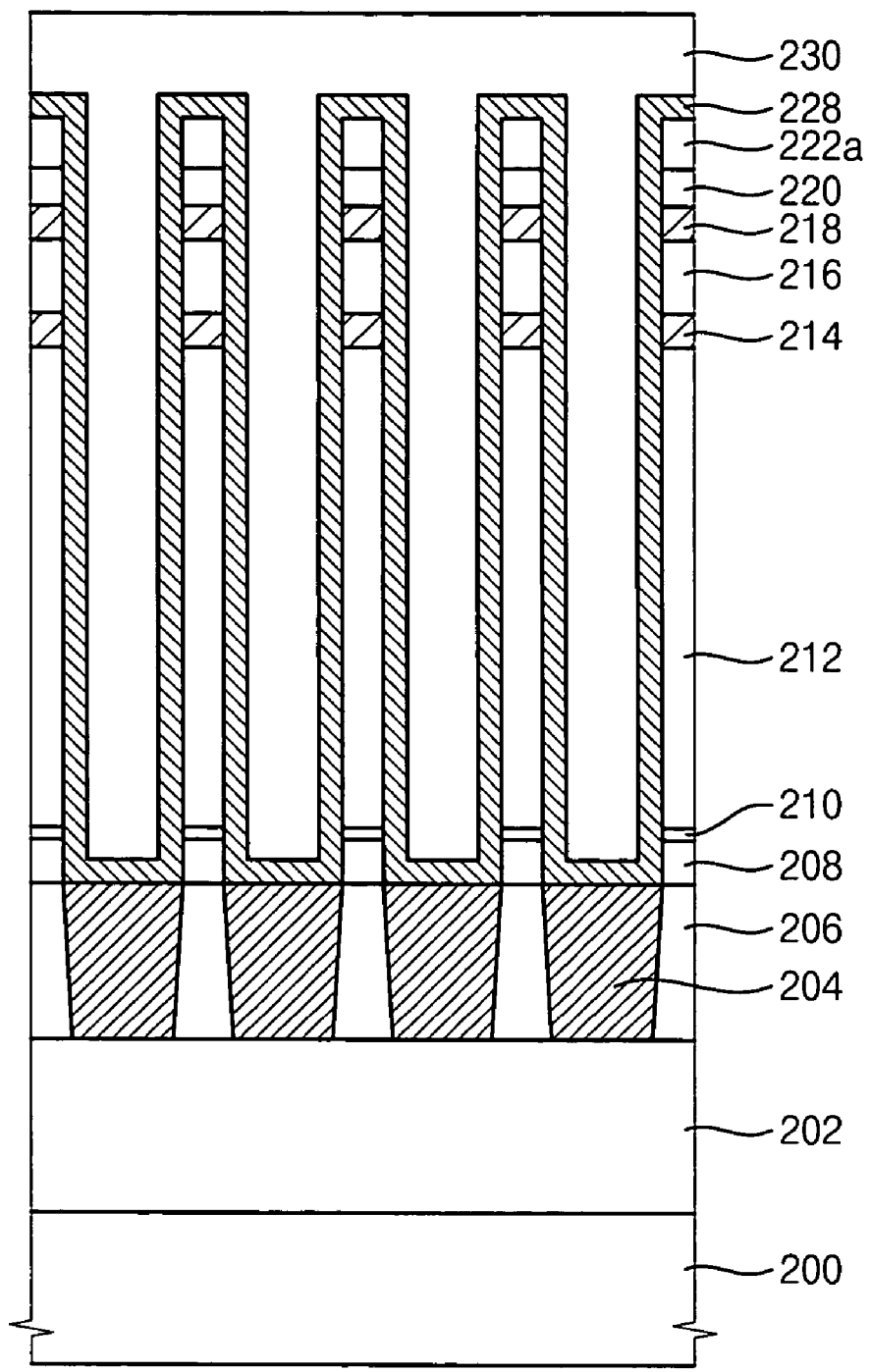

FIGS. 30 and 31 are cross-sectional views of the semiconductor substrate 200 illustrating the formation of a conductive layer 228 and a sacrificial layer 230 in the openings 226.

Referring to FIGS. 30 to 31, a conductive layer 228 may be formed on the contact structures 204, sidewalls 226*c* of the openings 226 and the mask pattern 222*a*. A sacrificial layer 230 may be formed on the conductive layer 228 to fill up the openings 226. The conductive layer 228 may be formed using polysilicon doped with impurities. The sacrificial layer 230 may be formed using an oxide such as silicon oxide. The conductive layer 228 and the sacrificial layer 230 may be formed by processes similar to those described above with reference to FIGS. 6 and 7.

Figure 32:
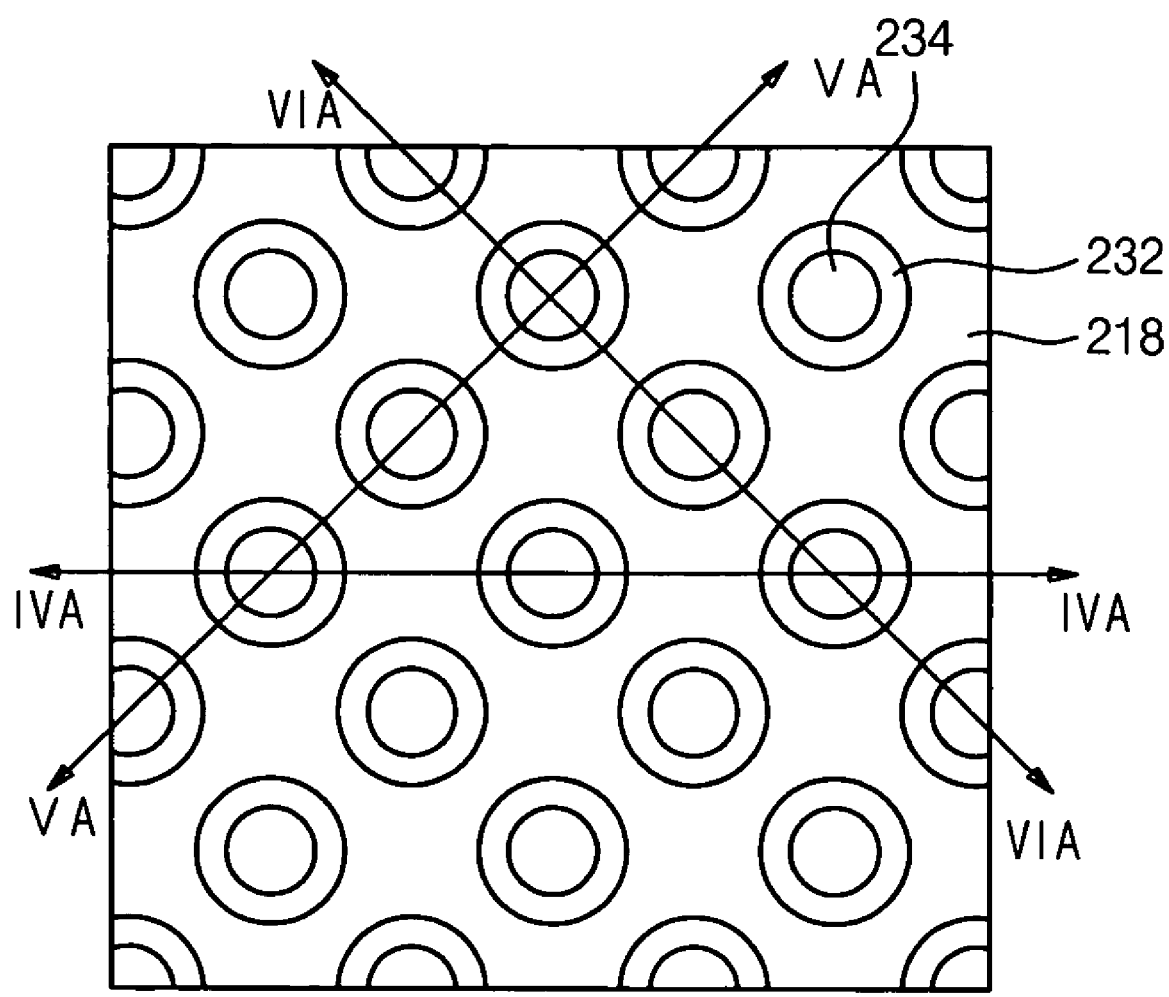
Figure 33:
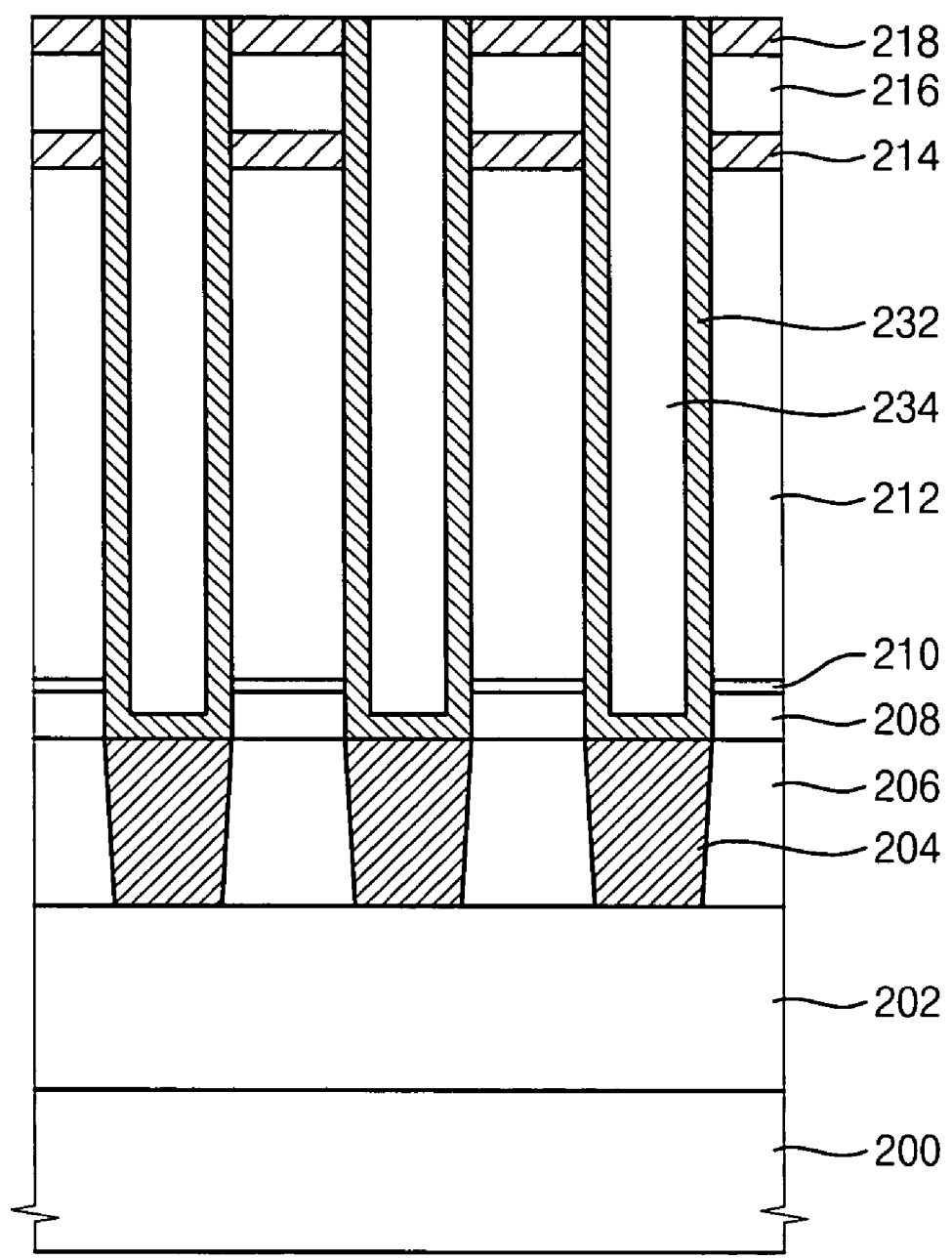
Figure 34:
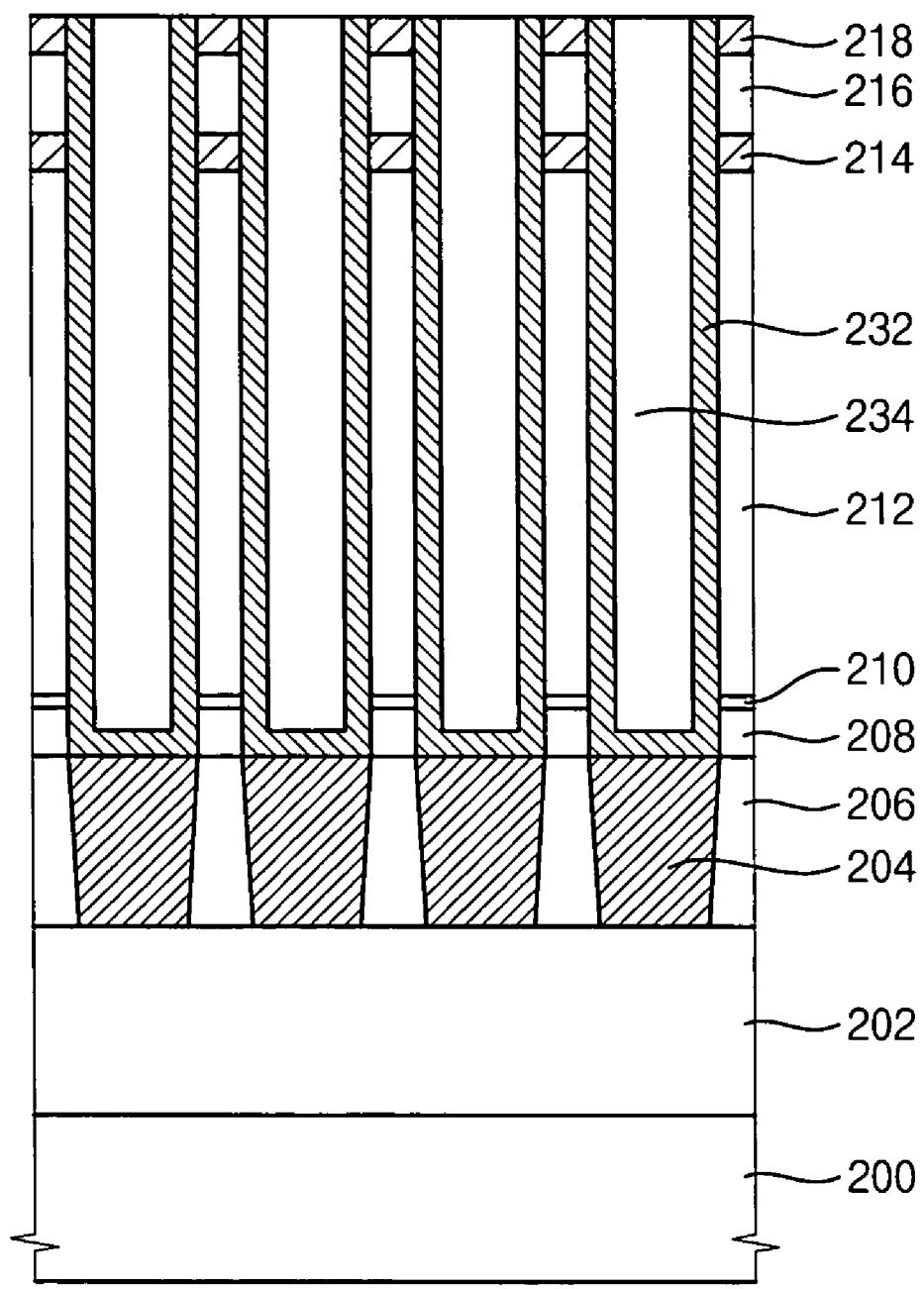

FIG. 32 is a plan view illustrating steps of forming the storage electrodes 232 and sacrificial layer patterns 234. FIG. 33 is a cross-sectional view illustrating the semiconductor substrate 200 along a line of IVA-IVA in FIG. 32, and FIG. 34 is a cross-sectional view illustrating the semiconductor substrate 200 along a line of VA-VA or a line of VIA-VIA in FIG. 32. In FIG. 32, the line of IVA-IVA is similar to the line of IA-IA in FIG. 8, and the lines of VA-VA and VIA-VIA are similar to the lines of IIA-IIA and IIIA-IIIA in FIG. 8.

Referring to FIGS. 32 to 34, the sacrificial layer 230, the conductive layer 228, the mask pattern 222*a* and the buffer oxide layer 220*a* are partially removed by a CMP process until the polishing stop layer 218 is exposed to thereby form the storage electrodes 232 and the sacrificial layer patterns 234, with the polishing stop layer 218 serving as an end layer of the CMP process. Thus, the polishing stop layer 218 may uniformly enclose the storage electrodes 232 after the CMP process so that the storage electrodes 232 in the unit cell may have a uniform height.

The polishing stop layer 218 and the third mold layer 216 may be sequentially removed by an etching process so that upper portions of the storage electrodes 232 may be exposed. Sacrificial spacers (not shown) may be formed on sidewalls of the upper portions of the storage electrodes 232 as described above. Since the heights of the storage electrodes 232 are substantially uniform, the heights of the sacrificial spacers may be substantially similar to one another. The sacrificial spacers may be formed by processes similar to those described above with reference to FIGS. 8 to 19.

The second mold layer 214 may be partially removed using the sacrificial spacers as etching masks to form stabilizing members (not shown) that enclose the storage electrodes 232, respectively. Thus, the storage electrodes 232 may have excellent structural stability in comparison with conventional storage electrodes.

A dielectric layer and a plate electrode may be formed sequentially on the storage electrodes 232 to thereby complete capacitors over the semiconductor substrate 200. The stabilizing members, the dielectric layer and the plate electrode may be formed by processes similar to those described with reference to FIGS. 20 to 25.

According to some embodiments of the invention, a sacrificial layer including USG that has good step coverage and an additional sacrificial layer including PE-TEOS that is almost free of the loading effect may be provided to form sacrificial spacers on sidewalls of upper portions of storage electrodes. The sacrificial spacers may be used to define stabilizing members which may support and stabilize the storage electrodes. Thus, the stabilizing members may be uniformly formed to enclose the upper portions of the storage electrodes by partially etching a mold layer using the sacrificial spacers as etching masks. Therefore, the storage electrodes in a unit cell of a semiconductor device may be structurally stable even though the storage electrodes have extremely large heights. In some embodiments of the invention, a polishing stop layer may be formed on the stabilizing members supporting the storage electrodes so that the stabilizing members may be more uniformly formed to improve the structural stability of the storage electrodes. As a result, capacitors having the stabilizing members may be less likely to suffer a 2-bit failure generated between adjacent capacitors. Furthermore, the structural stability and capacitance of the capacitors may be improved.

The foregoing is illustrative of the present invention and is not to be construed as limiting thereof. Although exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

What is claimed is:

1. A method of forming capacitors, comprising:

forming a first mold layer and a second mold layer on a substrate;

forming storage electrodes through the second mold layer and the first mold layer, upper portions of the storage electrodes being protruded from the second mold layer, the storage electrodes arranged on the substrate in a regular two dimensional configuration;

forming a first sacrificial layer on the storage electrodes and the second mold layer, the sacrificial layer partially filling up a gap between adjacent storage electrodes along a first direction and filling up a gap between the adjacent storage electrodes along a second direction, a first recess being formed between the adjacent storage electrodes along the first direction;

forming sacrificial spacers on sidewalls of the storage electrodes by etching the first sacrificial layer, the sacrificial spacers defining an opening exposing the second mold layer between the adjacent storage electrodes along the first direction;

etching the exposed second mold layer to expose the first mold layer;

removing the first mold layer and the sacrificial spacers; and forming a dielectric layer and a plate electrode on the storage electrodes.

2. The method of claim 1, further comprising:

forming a second sacrificial layer on the first sacrificial layer, wherein forming sacrificial spacers on the sidewalls of the storage electrode comprises etching the second and the first sacrificial layers to define an opening exposing the second mold layer.

3. The method of claim 2, wherein forming the second sacrificial layer further comprises partially filling the first recess, thereby forming a second recess.

4. The method of claim 2, wherein the first sacrificial layer is formed using an ozone gas and a tetraethyl orthosilicate gas by a chemical vapor deposition process.

5. The method of claim 2, wherein the second sacrificial layer is formed using an oxygen gas and a tetraethyl orthosilicate gas by a plasma enhanced chemical vapor deposition process.

6. The method of claim 1, wherein forming the storage electrodes comprises:

forming a third mold layer on the second mold layer;

forming first openings exposing contact structures through the third mold layer, the second mold layer and the first mold layer;

forming a conductive layer on the contact structures, sidewalls of the first openings and the third mold layer;

forming a third sacrificial layer on the conductive layer;

removing portions of the third sacrificial layer and the conductive layer until the third mold layer is exposed, to thereby form storage electrodes and sacrificial layer patterns within the storage electrodes; and exposing the upper portions of the storage electrodes by removing the third mold layer and upper portions of the sacrificial layer patterns.

7. The method of claim 6, wherein the first mold layer and the third mold layer pattern comprise silicon oxide, and the second mold layer comprises silicon nitride.

8. The method of claim 7, wherein the third sacrificial layer comprises a same material as the third mold layer.

9. The method of claim 6, wherein forming first openings further comprises:

forming a mask pattern on the third mold layer; and anisotropically etching the third mold layer, the second mold layer and the first mold layer using the mask pattern as an etching mask.

10. The method of claim 1, wherein forming the storage electrodes comprises:

forming a third mold layer on the second mold layer;

forming a polishing stop layer on the third mold layer;

forming first openings exposing contact structures through the polishing stop layer, the third mold layer, the second mold layer and the first mold layer;

forming a conductive layer on the contact structures, sidewalls of the first openings and the polishing stop layer;

forming a third sacrificial layer on the conductive layer to fill up the first openings;

removing the third sacrificial layer and the conductive layer until the polishing stop layer is exposed to thereby form storage electrodes and sacrificial layer patterns in the storage electrodes; and exposing upper portions of the storage electrodes by removing the polishing stop layer, the third mold layer and upper portions of the sacrificial layer patterns.

11. The method of claim 10, wherein the polishing stop layer comprises silicon nitride.

12. The method of claim 10, further comprising forming a buffer oxide layer on the polishing stop layer.

13. The method of claim 12, wherein forming the first openings further comprises:

forming a mask pattern on the buffer oxide layer; and anisotropically etching the buffer oxide layer, the polishing stop layer, the third mold layer, the second mold layer and the first mold layer using the mask pattern as an etching mask.

14. The method of claim 13, wherein the mask pattern comprises polysilicon.

* * * * *